(12) United States Patent
Takizawa et al.

(10) Patent No.: US 8,283,677 B2
(45) Date of Patent: Oct. 9, 2012

(54) NITRIDE SEMICONDUCTOR LIGHT-EMITTING DEVICE

(75) Inventors: Toshiyuki Takizawa, Kyoto (JP); Tetsuzo Ueda, Osaka (JP); Manabu Usuda, Osaka (JP)

(73) Assignee: Panasonic Corporation, Osaka (JP)

( * ) Notice: Subject to any disclaimer, the term of this patent is extended or adjusted under 35 U.S.C. 154(b) by 92 days.

(21) Appl. No.: 12/933,283

(22) PCT Filed: Feb. 2, 2009

(86) PCT No.: PCT/JP2009/000379
§ 371 (c)(1),
(2), (4) Date: Sep. 17, 2010

(87) PCT Pub. No.: WO2009/118979
PCT Pub. Date: Oct. 1, 2009

(65) Prior Publication Data
US 2011/0012169 A1 Jan. 20, 2011

(30) Foreign Application Priority Data

Mar. 28, 2008 (JP) .................. 2008-087975

(51) Int. Cl.
*H01L 27/15* (2006.01)
*H01L 21/00* (2006.01)
(52) U.S. Cl. .......... 257/81; 257/103; 257/257; 257/290; 257/E33.028; 438/24; 438/29; 438/42; 438/46
(58) Field of Classification Search ............ 257/79, 257/81, 103, 228, 257, 290, 431; 438/22, 438/24, 29, 37, 42, 46; 313/504, 506; 428/690, 428/917
See application file for complete search history.

(56) References Cited

U.S. PATENT DOCUMENTS

| 6,015,979 | A | 1/2000 | Sugiura et al. |
| 6,153,010 | A | 11/2000 | Kiyoku et al. |
| 7,846,820 | B2 | 12/2010 | Ishibashi et al. |
| 2002/0038870 | A1 | 4/2002 | Kunisato et al. |

(Continued)

FOREIGN PATENT DOCUMENTS

JP 11-103135 4/1999

(Continued)

OTHER PUBLICATIONS

Egawa, T., et al., "Improved Characteristics of Blue and Green InGaN-Based Light-Emitting Diodes on Si Grown by Metalorganic Chemical Vapor Deposition", Jpn. J. Appl. Phys., Jun. 2002, pp. L663-L664, vol. 41 Part 2 No. 6B, The Japan Society of Applied Physics.

(Continued)

*Primary Examiner* — Hsien Ming Lee
(74) *Attorney, Agent, or Firm* — McDermott Will & Emery LLP

(57) ABSTRACT

A nitride semiconductor light-emitting device includes a substrate (101) made of silicon, a mask film (102) made of silicon oxide, formed on a principal surface of the substrate (101), and having at least one opening (102a), a seed layer (104) made of GaN selectively formed on the substrate (101) in the opening (102a), an LEG layer (105) formed on a side surface of the seed layer (104), and an n-type GaN layer (106), an active layer (107), and a p-type GaN layer (108) which are formed on the LEG layer (105). The LEG layer (105) is formed by crystal growth using an organic nitrogen material as a nitrogen source.

13 Claims, 20 Drawing Sheets

U.S. PATENT DOCUMENTS

| | | |
|---|---|---|
| 2002/0185660 A1 | 12/2002 | Biwa et al. |
| 2004/0185589 A1* | 9/2004 | Ishikawa et al. ............... 438/47 |
| 2005/0145865 A1 | 7/2005 | Okuyama et al. |
| 2007/0164292 A1 | 7/2007 | Okuyama |
| 2007/0170441 A1 | 7/2007 | Takizawa et al. |
| 2008/0248603 A1 | 10/2008 | Kunisato et al. |

FOREIGN PATENT DOCUMENTS

| | | |
|---|---|---|
| JP | 2001-135580 | 5/2001 |
| JP | 3491538 | 11/2003 |
| JP | 3567826 | 6/2004 |
| JP | 2006-128450 | 5/2006 |
| JP | 2006-270125 | 10/2006 |
| JP | 2006-319277 | 11/2006 |
| JP | 2007-235100 | 9/2007 |

OTHER PUBLICATIONS

Shimizu, J., et al., "Maskless Epitaxial Lateral Overgrowth of GaN Using Dimethylhydrazine as a Nitrogen Precursor", IEICE Technical Report, Sep. 2006, pp. 97-101, vol. 106 No. 271.

* cited by examiner (a)

(b)

(c)

(d)

(a)

(b)

(c)

(a)

(b)

(a)

(b)

(c)

(d)

(a)

(b)

(c)

(a)

(b)

(c)

NITRIDE SEMICONDUCTOR LIGHT-EMITTING DEVICE

RELATED APPLICATIONS

This application is the U.S. National Phase under 35 U.S.C. §371 of International Application No. PCT/JP2009/000379, filed on Feb. 2, 2009, which in turn claims the benefit of Japanese Application No. 2008-087975, filed on Mar. 28, 2008, the disclosures of which Applications are incorporated by reference herein.

TECHNICAL FIELD

The present invention relates to nitride semiconductor light-emitting devices made of gallium nitride (GaN)-based compound semiconductors and including a light-emitting diode, a semiconductor laser diode, or the like.

BACKGROUND ART

Light-emitting diodes are used in display units of numerous electronic apparatuses owing to their low power consumption, long life, and small size. Recently, the light-emitting diode is widely used in personal products, such as mobile telephones (for button illumination) and the like. Early light-emitting diodes had a low emission intensity and a longer emission wavelength than that of green light and therefore had only limited applications. In recent years, light-emitting diodes made of nitride semiconductors have been put into practical use, and various light-emitting diodes having a high luminance have been mass-produced. Therefore, these light-emitting diodes are applied to light sources for outdoor display apparatuses, automotive headlamps, indoor illumination, and the like.

The nitride semiconductors are gallium nitride (GaN)-based materials. In particular, the emission wavelength can be controlled by adding indium (In) to GaN. This property contributes to the commercialization of high-luminance blue-light-emitting diodes. In such nitride light-emitting diodes, a substrate made of sapphire (single crystal $Al_2O_3$), silicon carbide (SiC), or the like is employed for growth of the nitride semiconductor. The sapphire substrate is most commonly used for crystal growth of the nitride semiconductor. Because sapphire is transparent to emission light, the emission light can be advantageously extracted through the back surface of the element as well. However, because sapphire is an insulator, the electrodes necessarily need to be provided on the upper surface (nitride semiconductor side), and also, because sapphire is considerably rigid, it is difficult to process sapphire, which is a problem. On the other hand, SiC has a lattice constant close to that of GaN, and therefore, a high-quality crystal of the nitride semiconductor can be advantageously grown. However, the SiC substrate is expensive, inevitably leading to a high cost per chip.

Also, in recent years, some self-supporting substrates made of gallium nitride (GaN) having a sufficiently low dislocation density have been put into practical use as substrates for growth of the nitride semiconductor. These substrates allow not only heteroepitaxial growth, but also homoepitaxial growth, on the sapphire and SiC substrates, whereby crystal growth having a low dislocation density can be achieved. Therefore, the substrate is widely used in blue-violet nitride semiconductor laser diodes which are employed as light sources for next-generation optical disk apparatuses. On the other hand, attempts are being made to achieve mass-production of a nitride light-emitting diode employing the GaN self-supporting substrate. However, the GaN self-supporting substrate is considerably expensive and therefore the cost per chip is also high compared to the SiC substrate.

Moreover, in recent years, attempts have been made to employ a substrate made of silicon (Si) for growth of the nitride semiconductor (see, for example, NON-PATENT DOCUMENT 1). Inexpensive Si substrates in the form of a wafer having a diameter of up to as large as about 30.5 cm (=12 inches) are available, and therefore, the cost per chip can be reduced to a relatively low level. If a semiconductor laser diode can be implemented on the silicon substrate, the cost per chip can be reduced by at least one order of magnitude compared to the current cost.

CITATION LIST

Patent Document
PATENT DOCUMENT 1: Japanese Patent Publication No. 2007-235100
Non-Patent Document
NON-PATENT DOCUMENT 1: T. Egawa et al. "Improved Characteristics of Blue and Green InGaN-Based Light-Emitting Diodes on Si Grown by Metalorganic Chemical Vapor Deposition," Jpn. J. Appl. Physics Vol. 41 (2002), pp. L663-L664

SUMMARY OF THE INVENTION

Technical Problem

However, because the difference in lattice constant between silicon (Si) and gallium nitride (GaN) is as large as 20%, a nitride semiconductor layer grown on the Si substrate has a considerably high dislocation density, resulting in a lower emission efficiency in the active layer than that obtained when the sapphire substrate, the SiC substrate, or the GaN self-supporting substrate is employed, which is a problem. To solve this problem, for example, an attempt has been made to perform selective growth in order to reduce defects. However, in the selective growth technique employing only ammonia ($NH_3$) as a nitrogen source, the grown nitride semiconductor layer has a large thickness, and therefore, cracks occur in a surface of the nitride semiconductor layer, which is a problem. This is because the large difference in thermal expansion coefficient between Si and GaN causes an increase in tensile strain in the nitride semiconductor layer during a process of decreasing the temperature after crystal growth.

The present invention has been made to solve the aforementioned problems. It is an object of the present invention to provide a high-luminance and high-reliability nitride semiconductor light-emitting device which has few defects and is free from cracks even when the substrate for growth of the nitride semiconductor is made of silicon.

Solution to the Problem

To achieve the object, the nitride semiconductor light-emitting device of the present invention has a structure in which a first nitride semiconductor layer (seed layer) is selectively grown on a substrate for crystal growth, a second nitride semiconductor (lateral epitaxial growth (LEG)) layer is then selectively grown on a side surface of the first nitride semiconductor layer, and a third nitride semiconductor layer including an emission layer (active layer) is then grown on the second nitride semiconductor layer selectively grown.

The present inventors have found that the nitride semiconductor layer (LEG layer) can be grown only on the side surface of the seed layer by using an organic nitrogen material, such as dimethylhydrazine (DMHy) or the like. The present inventors also have experimentally found that the nitride semiconductor layer including the active layer which is grown on the LEG layer has no dislocations and is free from cracks, resulting in a significant increase in the emission efficiency of the active layer. This is because dislocations or the like can be efficiently oriented in lateral directions (directions parallel to a principal surface of the substrate) in the LEG layer, and the overall thickness of the nitride semiconductor layer can be reduced.

The present invention has been made based on the aforementioned findings and specifically has the following structure.

A nitride semiconductor light-emitting device according to the present invention includes a substrate, a mask film formed on a principal surface of the substrate and having at least one opening, a first nitride semiconductor layer selectively formed on the substrate in the opening, a second nitride semiconductor layer formed on a side surface of the first nitride semiconductor layer excluding a surface of the first nitride semiconductor layer parallel to the principal surface of the substrate, and a third nitride semiconductor layer formed on the second nitride semiconductor layer and including an emission layer.

According to the nitride semiconductor light-emitting device of the present invention, the first nitride semiconductor layer, which is to serve as a seed layer, is selectively formed from the opening of the mask film, and the second nitride semiconductor layer is formed on the side surface of the first nitride semiconductor layer. Here, when the second nitride semiconductor layer is formed by crystal growth using an organic nitrogen material as a nitrogen source, the second nitride semiconductor layer is grown substantially parallel to the substrate surface from the side surface of the first nitride semiconductor layer. In this case, dislocations and the like also extend parallel to the substrate surface. Therefore, considerably few dislocations or the like occur in the third nitride semiconductor layer including the emission layer which is formed on the second nitride semiconductor layer, and the overall thickness of the first to third nitride semiconductor layers can be reduced. As a result, a high-luminance and high-reliability nitride semiconductor light-emitting device can be provided.

In the nitride semiconductor light-emitting device of the present invention, the second nitride semiconductor layer preferably has a lower hydrogen concentration or a higher carbon concentration than those of the first and third nitride semiconductor layers.

Thus, the hydrogen concentration of the second nitride semiconductor layer is lower than that of the third nitride semiconductor layer, and therefore, the diffusion of hydrogen from the second nitride semiconductor layer to the emission layer of the third nitride semiconductor layer can be efficiently reduced or prevented, whereby emission operation can be performed with a stable operating voltage. Moreover, by intentionally incorporating carbon into the second nitride semiconductor layer, the lattice constant of the second nitride semiconductor layer can be increased. In other words, the lattice constant of the third nitride semiconductor layer formed on the second nitride semiconductor layer can also be increased. As a result, when the emission layer is doped with indium (In), the indium composition can be increased. In other words, the emission wavelength can be increased without decreasing the growth temperature of the InGaN layer which is lower than that of a typical GaN layer. Therefore, a high-luminance and high-reliability nitride semiconductor light-emitting device can be provided.

In the nitride semiconductor light-emitting device of the present invention, the side surface of the first nitride semiconductor layer preferably has an upper portion and a lower portion, and the upper portion is preferably sloped toward the inside of the opening with respect to the lower portion.

The first nitride semiconductor layer which is selectively grown from the opening of the mask film formed on the substrate belongs to the hexagonal system, and therefore, the upper portion of the side surface is sloped toward the inside of the opening with respect to the lower portion. Therefore, the first nitride semiconductor layer is selectively grown from the opening of the mask film.

The nitride semiconductor light-emitting device preferably further includes a fourth nitride semiconductor layer formed on the mask film, covering the opening, and made of aluminum as a major component. The first nitride semiconductor layer is preferably formed on the fourth nitride semiconductor layer in the opening.

In this case, the nitride semiconductor containing aluminum as a major component has a high strength, whereby a crack occurring in each semiconductor layer formed on the fourth nitride semiconductor layer can be efficiently reduced or prevented.

In the nitride semiconductor light-emitting device of the present invention, at least one of an interface between the first and second nitride semiconductor layers and an interface between the second and third nitride semiconductor layers preferably does not contain oxygen.

In this case, the first and second nitride semiconductor layers or the second and third nitride semiconductor layers are continuously formed (without removal from the growth chamber) by crystal growth, resulting in an ideal interface between each semiconductor layer. Moreover, it is possible to reduce or prevent a defect caused by an impurity and unwanted impurity diffusion.

In the nitride semiconductor light-emitting device of the present invention, the mask film preferably has a reflectance of 50% or more with respect to light emitted by the emission layer.

In this case, light emitted from the emission layer toward the substrate can be reflected toward the third nitride semiconductor layer, whereby emission light can be efficiently extracted to the outside.

In the nitride semiconductor light-emitting device of the present invention, the mask film is preferably conductive and is preferably electrically connected to the third nitride semiconductor layer.

In this case, an electrode and an interconnect which are typically formed on the third nitride semiconductor layer can be buried in the mask film located below the third nitride semiconductor layer, whereby the electrode and the interconnect do not block emission light, resulting in higher luminance.

In the nitride semiconductor light-emitting device of the present invention, a plurality of the openings are preferably formed in the mask film, and the second and third nitride semiconductor layers formed for one of adjacent ones of the openings, and the second and third nitride semiconductor layers formed for the other of the adjacent openings, are preferably spaced from each other.

In this case, the second and third nitride semiconductor layers for one opening are hindered or prevented from being affected by, for example, thermal stress during decreasing of temperature after crystal growth or the like from the second and third nitride semiconductor layers of the adjacent opening. Therefore, a crack occurring in each second nitride semiconductor layer and each third nitride semiconductor layer can be further reduced or prevented.

In the nitride semiconductor light-emitting device of the present invention, the mask film preferably has a void portion.

When the mask film thus has a void portion such as a crack or the like, the opening of the mask film is substantially the only connection portion between the substrate and each of the first to third nitride semiconductor layers. As a result, stress applied from the substrate to each nitride semiconductor layer is further reduced, whereby a crack occurring in each nitride semiconductor layer can be further reduced or prevented.

In the nitride semiconductor light-emitting device of the present invention, the third nitride semiconductor layer is preferably also formed on the first nitride semiconductor layer, and an emission wavelength from the emission layer directly above the second nitride semiconductor layer is preferably longer than an emission wavelength from the emission layer directly above the first nitride semiconductor layer.

In this configuration, it means that the emission layer directly above the second nitride semiconductor layer has a smaller forbidden band (band gap energy) than that of the emission layer directly above the first nitride semiconductor layer. Therefore, when carriers are injected to the third nitride semiconductor layer, a larger number of carriers flow through the emission layer directly above the second nitride semiconductor layer having a lower dislocation density, resulting in an improvement in the luminance and the reliability.

In the nitride semiconductor light-emitting device of the present invention, the emission layer preferably has a composition containing indium, and the emission layer directly above the second nitride semiconductor layer preferably has a larger indium composition than that of the emission layer directly above the first nitride semiconductor layer.

Also in this configuration, it means that the emission layer directly above the second nitride semiconductor layer has a smaller forbidden band than that of the emission layer directly above the first nitride semiconductor layer. Therefore, when carriers are injected to the third nitride semiconductor layer, a larger number of carriers flow through the emission layer directly above the second nitride semiconductor layer having a lower dislocation density, resulting in an improvement in the luminance and the reliability.

In the nitride semiconductor light-emitting device of the present invention, the substrate is preferably made of silicon.

When the substrate for growing the first nitride semiconductor layer is thus made of silicon (Si), a high-luminance and high-reliability nitride semiconductor light-emitting device can be provided at low cost.

In the nitride semiconductor light-emitting device of the present invention, an upper portion contacting the mask film of the substrate preferably has a silicon content of at least 50%.

In this case, not only a bulk silicon substrate, but also a silicon carbide (SiC) substrate in which at least an upper portion thereof is carbonized, can be used.

In the nitride semiconductor light-emitting device of the present invention, an upper portion of the mask film preferably has a composition which does not allow growth of the first nitride semiconductor layer.

In this case, the first nitride semiconductor layer can be reliably formed from the opening of the mask film.

In this case, the upper portion of the mask film is preferably made of silicon oxide.

Advantages of the Invention

According to the nitride semiconductor light-emitting device of the present invention, even when the substrate for growing a nitride semiconductor is made of silicon, a high-luminance and high-reliability nitride semiconductor light-emitting device which has few defects and is free from cracks can be provided.

BRIEF DESCRIPTION OF THE DRAWINGS

FIG. 8(a) is a scanning electron microscope image, FIG. 8(b) is a cathode luminescence image in an entire wavelength region, and FIG. 8(c) is a wavelength mapping image.

DESCRIPTION OF REFERENCE CHARACTERS

101 Substrate
102 Mask Film
102a Opening
103 Buffer Layer
104 Seed Layer
105 LEG Layer
106 n-type GaN Layer
107 Active Layer
108 p-type GaN Layer
109 Translucent Electrode
110 n-side Electrode
111 p-side Electrode
201 Substrate
201a Titanium Silicide Layer
202 First Insulating Film
203 Conductive Film
204 Second Insulating Film
205 Mask Film
205a Opening
301 Reflective Film
A Element
B Element
400 SOI Substrate
401 Si Substrate
402 Insulating Layer
403 Si Thin Film Layer
403a First Pattern
403b Second Pattern
403c Third Pattern
404 Mask Film
404a Opening
405 Buffer Layer
406 Seed Layer
407 LEG Layer
408 n-type GaN Layer
409 Active Layer
410 p-type GaN Layer
411 p-side Electrode
412 Insulating Film
413 n-side Electrode
501 Substrate
502 Mask Film
502a Opening
503 Buffer Layer
504 Seed Layer
505 LEG Layer
506 n-type GaN Layer
507 Active Layer
508 p-type GaN Layer
509 n-side Electrode
510 p-side Electrode

DESCRIPTION OF EMBODIMENTS

First Embodiment

A first embodiment of the present invention will be described with reference to the accompanying drawings.

Figure 1:
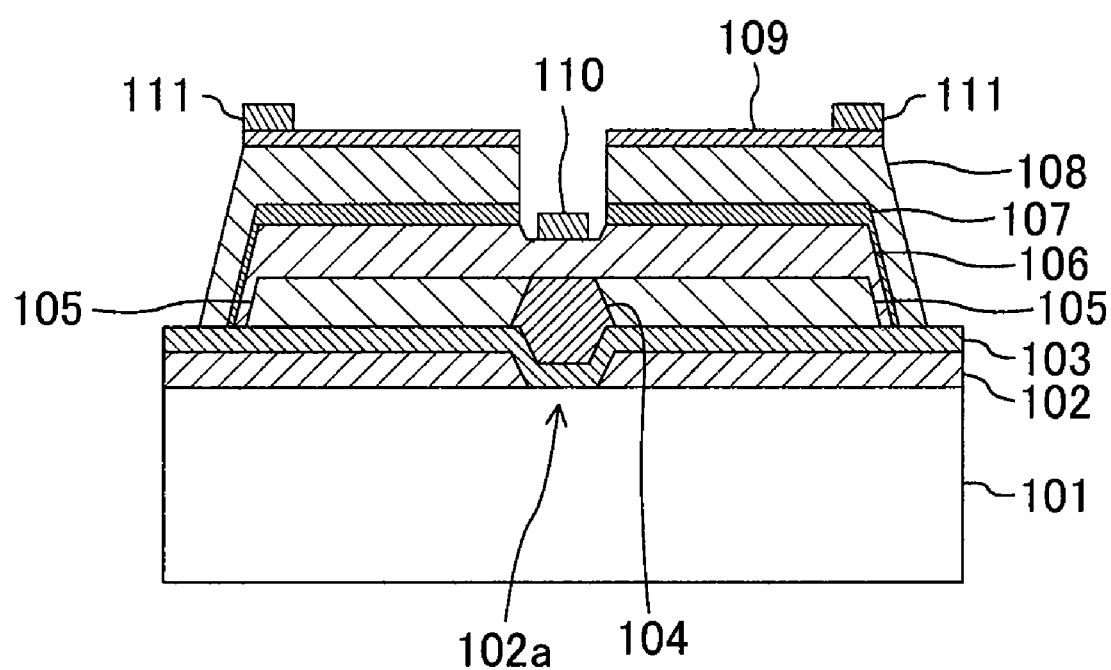
FIG. 1 is a cross-sectional view showing a nitride semiconductor light-emitting device according to a first embodiment of the present invention.

FIG. 1 is a cross-sectional view of a structure of a nitride light-emitting diode in a nitride semiconductor light-emitting device according to the first embodiment of the present invention.

The light-emitting diode of FIG. 1 is a nitride blue light-emitting diode which is made of a hexagonal-system GaN-based semiconductor and has an emission wavelength of 450 nm. In FIG. 1, a mask film 102 which is made of, for example, silicon oxide ($SiO_2$) having a thickness of 50 nm and has an opening 102a is formed on a principal surface of a substrate 101 made of silicon (Si), where the principal surface has a plane orientation (111) (i.e., a (111) plane). Here, the opening 102a is in the shape of a rectangle extending in a direction perpendicular to the plane of the drawing as viewed from the top, as described below. Plane orientations perpendicular to a cross-section (the plane of the drawing) of the substrate 101 made of Si belonging to the cubic system are {1-10}, and plane orientations parallel to the cross-section are {11-2}. Note that a minus sign "−" added to a Miller index in a plane orientation indicates the inverse of the index following the minus sign for the sake of convenience.

A buffer layer 103 made of, for example, aluminum nitride (AlN) having a thickness of 40 nm is formed on an entire surface including the opening 102a of the mask film 102. A seed layer 104 which is a first nitride semiconductor layer made of gallium nitride (GaN) having a thickness of 100 nm is selectively formed, by crystal growth, on the buffer layer 103 on a bottom surface of the opening 102a. Here, the buffer layer 103 and the seed layer 104 have a plane orientation (0001) parallel to the principal surface of the substrate 101, plane orientations {1-100} perpendicular to the cross-section (the plane of the drawing) of the substrate 101, and plane orientations {11-20} parallel to the cross-section. Note that the seed layer 104 has side surfaces whose upper portions are sloped toward the inside of the opening 102a with respect to a normal to the principal surface of the substrate 101 and have plane orientations {11-22}. The aforementioned plane orientations of Si and GaN semiconductors are also applied to embodiments below.

On the mask film 102, an LEG layer (second nitride semiconductor layer) 105 is formed which is selectively grown from each side surface of the seed layer 104 in lateral directions (directions parallel to the substrate surface).

An n-type GaN layer 106 having a thickness of 200 nm, an active layer (emission layer) 107 having a multiple quantum well structure made of InGaN, and a p-type GaN layer 108 having a thickness of 200 nm, which constitute a third nitride semiconductor layer, are successively formed, by crystal growth, on the LEG layer 105 including the seed layer 104.

A hollow portion in which the n-type GaN layer 106 is exposed is provided in the p-type GaN layer 108 and the active layer 107 directly above the seed layer 104. An n-side electrode 110 made of a multilayer film of titanium (Ti) and gold (Au) is formed on a bottom surface of the hollow portion. A translucent electrode 109 made of a multilayer film of nickel (Ni) and gold (Au) and having an overall thickness of 10 nm or less is formed on the p-type GaN layer 108 excluding the hollow portion. A p-side electrode 111 having the same structure as that of the n-side electrode 110 is formed on the translucent electrode 109 outside the hollow portion. Note that the n-side electrode 110 is not limited to the multilayer film of Ti/Au and may be made of a metal which can make an ohmic contact with the n-type GaN layer 106. Because the p-side electrode 111 is formed on the translucent electrode 109 made of Ni/Au, the p-side electrode 111 may be made of a metal having the same composition as that of the n-side electrode 110.

A method for fabricating the nitride light-emitting diode thus configured will be described with reference to the drawings.

FIGS. 2(a)-2(d) and 3(a)-3(c) are cross-sectional views for describing the method for fabricating the nitride light-emitting diode of the first embodiment of the present invention in the order in which the nitride light-emitting diode is fabricated.

Figure 2:
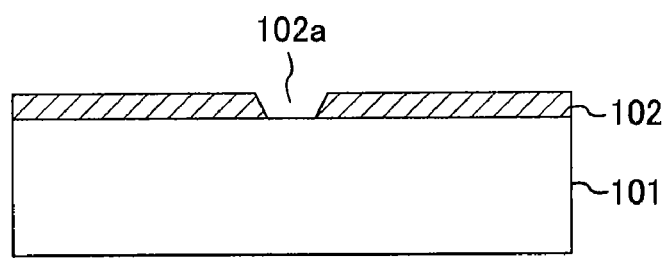
FIGS. 2(a)-2(d) are cross-sectional views for describing a method for fabricating the nitride semiconductor light-emitting device of the first embodiment of the present invention in the order in which the nitride semiconductor light-emitting device is fabricated.
Figure 2:
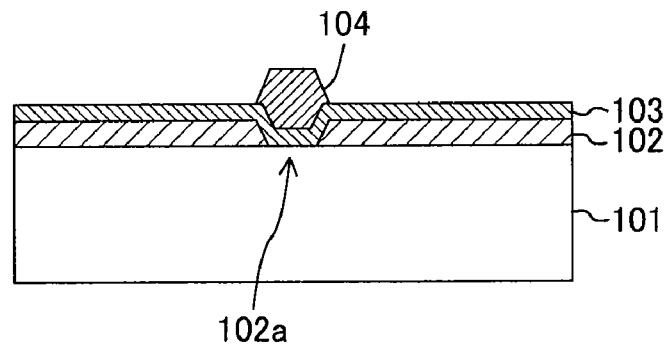
Figure 2:
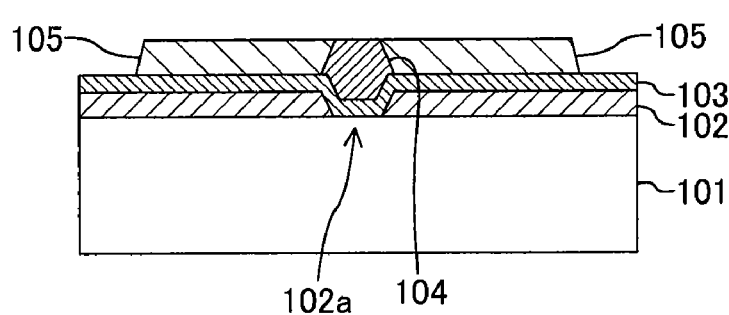
Figure 2:
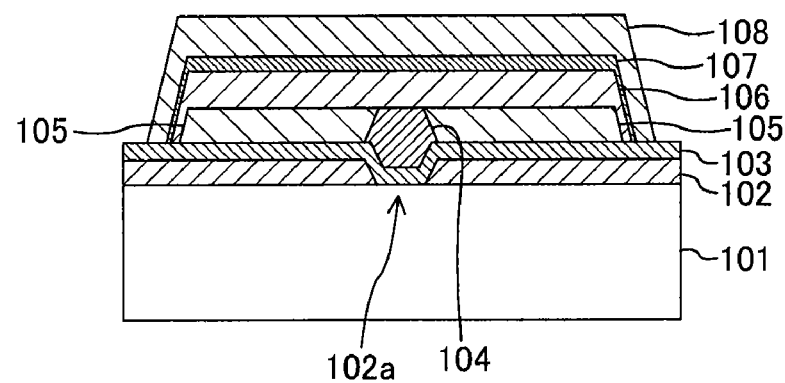

Initially, as shown in FIG. 2(a), the mask film 102 having a thickness of 50 nm is formed on the principal surface of the substrate 101 made of Si, where the principal surface has a plane orientation (111). Here, the mask film 102 is, for example, a thermal oxide film which is obtained by thermal oxidation in an oxygen atmosphere. Note that the plane orientation of Si of the substrate 101 in the figures and the plane orientation of each nitride semiconductor layer described below are similar to those of FIG. 1. Next, a resist (not shown) is applied onto the mask film 102, then patterned by light exposure (lithography), and then etched by immersing in a buffered aqueous hydrofluoric acid solution, thereby forming the opening 102a in the mask film 102. Thereafter, the resist is removed using an organic solvent, resulting in an underlying substrate as shown in FIG. 2(a).

Next, as shown in FIG. 2(b), the buffer layer 103 made of AlN having a thickness of 40 nm is grown on an entire surface of the prepared underlying substrate, i.e., the mask film 102 including the opening 102a by, for example, metal organic chemical vapor deposition (MOCVD). Next, the seed layer 104 made of GaN having a thickness of 100 nm is selectively grown on the buffer layer 103 in the opening 102a. Here, the crystal growth is performed at a growth temperature of about 1000° C. using trimethylgallium (TMG), trimethylaluminum (TMA), and ammonia ($NH_3$) as materials for gallium (Ga), aluminum (Al), and nitrogen (N). Thus, the buffer layer 103 made of AlN covers the entire surface of the underlying substrate. This is because the migration distance of AlN is short and the buffer layer 103 is grown on the entire surface of the underlying substrate no matter whether the opening 102a is present or absent. On the other hand, the seed layer 104 on the buffer layer 103 is grown only in the opening 102a of the underlying substrate.

The reason is as follows. Although the buffer layer 103 made of AlN covers the entire surface of the underlying substrate, only a portion in the opening 102a of the buffer layer 103 has the same crystallinity as that of Si in the substrate 101. In contrast to this, the crystallinity of AlN in a portion on the mask film 102 of the buffer layer 103 is less than that crystallinity. GaN has a much larger migration distance during growth than that of AlN. Therefore, after reaching the surface of the buffer layer 103, the gallium material is not immediately immobilized and travels around on the surface until the kinetic energy is dissipated. Thereafter, the gallium material is eventually settled on the portion in the opening 102a of the buffer layer 103, where the portion has good crystallinity. By such a mechanism, the seed layer 104 made of GaN is grown mainly on the portion in the opening 102a of the buffer layer 103. Here, the seed layer 104 has sloped side surfaces having plane orientations {11-22}, which are exposed. In contrast to this, the buffer layer 103 and the seed layer 104 are formed, by crystal growth, in a direction substantially perpendicular to the principal surface of the substrate 101 while maintaining the crystal information and dislocation direction of Si of the substrate 101, and therefore, most dislocations of the buffer layer 103 and the seed layer 104 are perpendicular to the principal surface of the substrate 101.

Next, as shown in FIG. 2(c), after the growth of the seed layer 104, the nitrogen material is changed from ammonia ($NH_3$) to dimethylhydrazine (DMHy), and the LEG layer 105 made of GaN is selectively formed, by crystal growth, from each side surface of the seed layer 104. In this case, the temperature of the crystal growth is about 800° C., and the supply of ammonia is stopped. Specifically, the growth of GaN using DMHy can be performed in a specific growth mode compared to when ammonia is used, and GaN is newly grown only from the side surfaces of the seed layer 104 only in lateral directions. The semiconductor layer which is grown only in the lateral directions is referred to as a lateral epitaxial growth (LEG) layer 105. Here, by setting the flow rate of DMHy to be high, high-quality crystallinity is maintained irrespective of the crystal growth rate of as high as about 10 µm/h. The LEG layer 105 has the same crystal plane orientation as that of the seed layer 104. Because the LEG layer 105 is thus grown only in the lateral direction, all dislocations at an interface with the seed layer 104 are bent in the lateral directions (directions parallel to the substrate surface).

As described above, the flow rate of DMHy is set to be high as a condition for growth of the LEG layer 105 made of GaN, whereby carbon (C) contained in the DMHy is intentionally (actively) incorporated into the LEG layer 105. The carbon actively incorporated into the LEG layer 105 has a function of increasing the lattice constant of the LEG layer 105, and also, a function of increasing the indium composition of the active layer 107 formed in a subsequent step. Here, the carbon concentration of the LEG layer 105 is, for example, within the range of about $1 \times 10^{19}$ $cm^{-3}$ to $5 \times 10^{20}$ $cm^{-3}$.

By employing DMHy as the nitrogen material for the LEG layer 105, the hydrogen (H) concentration of the LEG layer 105 can be decreased. This is because an unstable methyl ($CH_3$) group is freed in the process of thermally decomposing DMHy and is efficiently coupled with a hydrogen atom on the surface to form stable methane ($CH_4$). As a result, the hydrogen concentration of the LEG layer 105 is further decreased compared to the other nitride semiconductor layers, such as the n-type GaN layer 106 and the like. Therefore, the diffusion of hydrogen into the active layer 107 is efficiently reduced, which contributes to stabilization of the operating voltage of the light-emitting diode.

Here, the results of experiments conducted by the present inventors will be described in detail.

Figure 4:
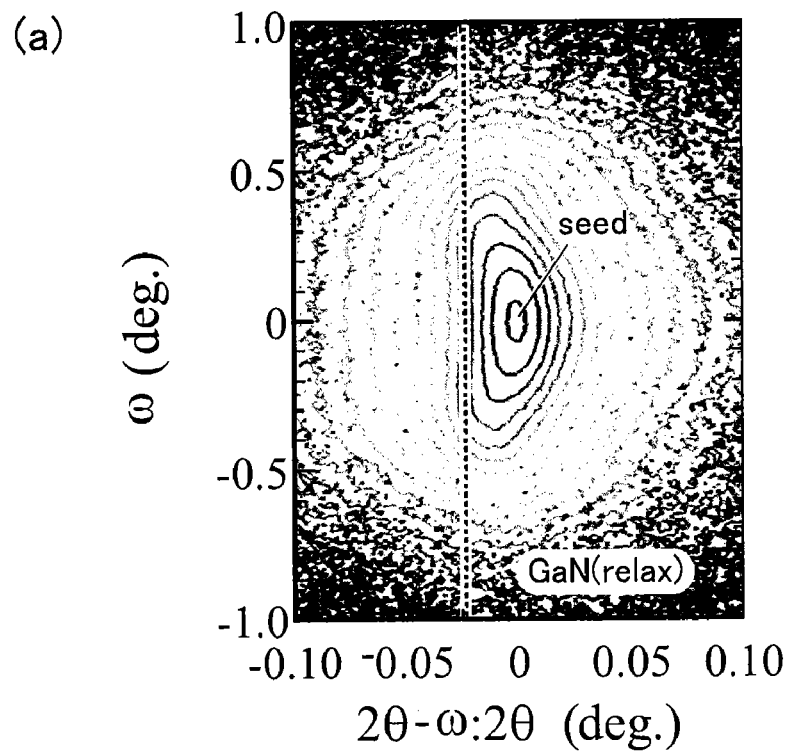
FIG. 4(a) is a graph showing the result of X-ray diffraction after crystal growth of a first semiconductor layer (seed layer) in the nitride semiconductor light-emitting device of the first embodiment of the present invention.
FIG. 4(b) is a graph showing the result of X-ray diffraction after crystal growth of a second semiconductor layer (LEG layer) in the nitride semiconductor light-emitting device of the first embodiment of the present invention.
Figure 4:
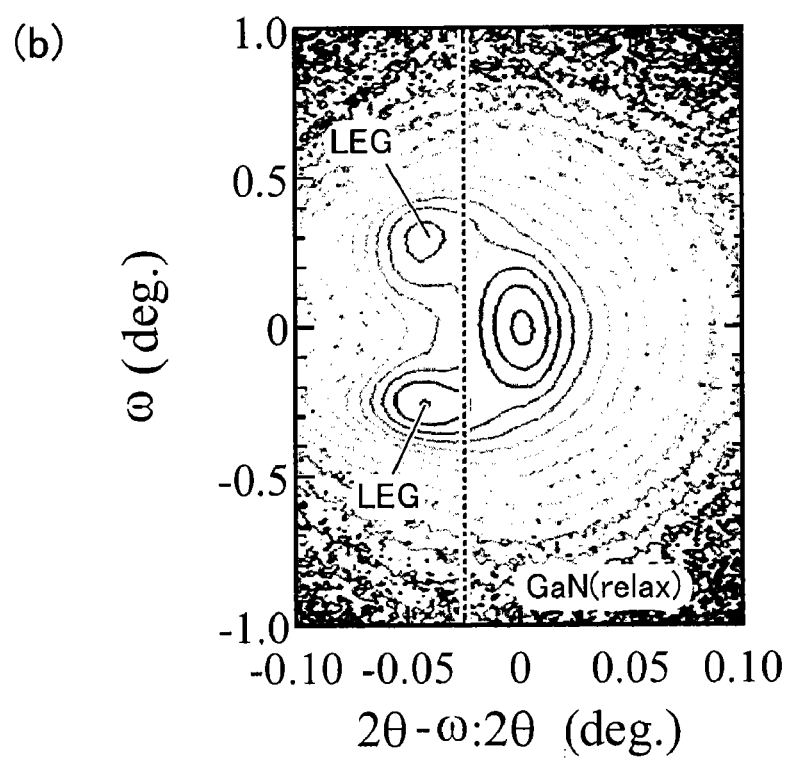

FIGS. 4(a) and 4(b) show the results of X-ray diffraction before and after the growth of the LEG layer 105 using DMHy. The diffraction peak is assumed to be for GaN (0002) constituting the seed layer 104. The horizontal axis is the 2θ–ω axis and corresponds to the reciprocal of the lattice constant. On the other hand, the vertical axis is the ω axis and represents the slope of crystal from the center. As can be seen from FIG. 4(a), a single GaN (0002) peak is observed. On the other hand, as can be seen from FIG. 4(b) indicating the result of X-ray diffraction after the growth of the LEG layer 105 using DMHy, there are two sharp peaks located at a lower angle region than that of the GaN (0002) peak. The two peaks are crystal information of the LEG layer 105. The short half-width indicates good crystallinity. Moreover, the lower angle region on the 2θ–ω axis indicates a larger lattice constant. This is because of the aforementioned effect of the carbon (C) intentionally incorporated. Moreover, there is an offset of about ±0.3 degrees with respect to the ω axis. This means that a normal to the upper surface of each LEG layer 105 is sloped toward the outside with respect to a normal to the opening 102a of the substrate 101.

Next, as shown in FIG. 2(d), crystal growth is continuously performed on the epitaxial structure of FIG. 2(c). Before the start of the crystal growth, the supply of DMHy is stopped and at the same time the supply of ammonia is started. The crystal growth temperature is increased to about 1000° C. which is an optimum temperature for the growth of the n-type GaN layer 106 and the subsequent epitaxial layers, and thereafter, MOCVD growth is performed. Here, the growth is performed using trimethylindium (TMI) as an indium (In) material added to the active layer 107. Silane (SiH$_4$) gas and bis(cyclopentadienyl)magnesium (Cp2Mg) are used as an n-type doping material and a p-type doping material, respectively. The other materials are the same as those for the LEG layer 105 and the preceding epitaxial layers.

Specifically, the n-type GaN layer 106 having a thickness of 200 nm and having a flat upper surface is grown on the seed layer 104 and the LEG layer 105. Next, the active layer 107 having a multiple quantum well structure (3QW) made of InGaN is grown on the n-type GaN layer 106. Here, the thickness and indium composition of each well layer in the active layer 107 are accurately controlled so that the emission wavelength is 450 nm. Next, the p-type GaN layer 108 having a thickness of 200 nm is grown on the active layer 107. Thereafter, the temperature is decreased while ammonia is caused to flow. Thus, the series of crystal growth processes is ended. In this case, the crystal growth is consistently performed from the underlying substrate of FIG. 2(a), and therefore, a contaminant such as oxygen or the like is not present at an interface between each crystal growth layer. Therefore, an unwanted defect or dislocation does not occur at the interface between each crystal growth layer. Moreover, the crystal growth is consistently performed without decreasing the temperature to room temperature, and therefore, unwanted thermal stress is not applied to each crystal growth layer, whereby good crystallinity can be maintained. In the first embodiment, the crystal growth layers, such as the LEG layer 105, the n-type GaN layer 106, and the like, are not independently grown on the buffer layer 103 made of AlN on the mask film 102. Each crystal growth layer is grown only from the seed layer 104. This is because, as described above, the crystallinity of AlN of the buffer layer 103 on the mask film 102 is low.

Figure 5:
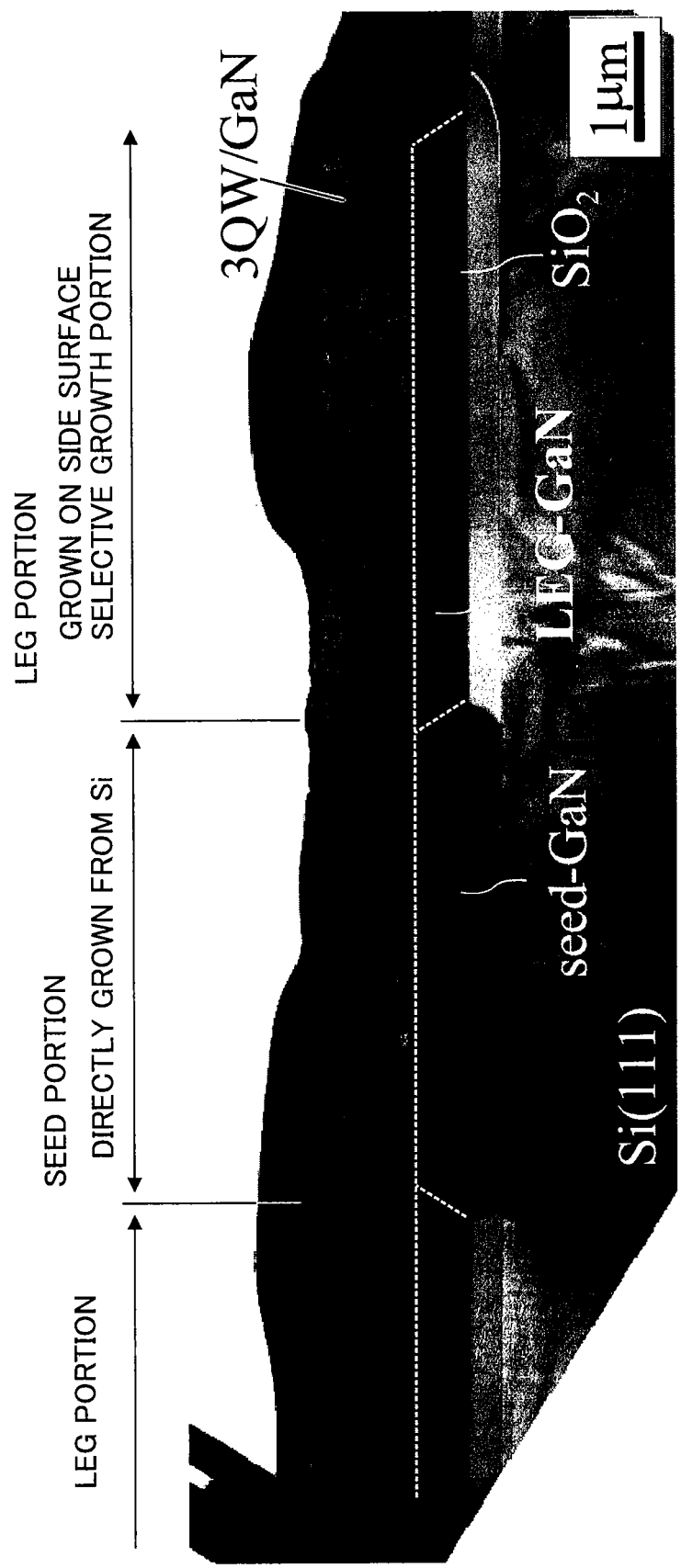
FIG. 5 is a transmission electron microscope image after crystal growth of a third semiconductor layer (active layer) in the nitride semiconductor light-emitting device of the first embodiment of the present invention.

A transmission electron microscope (TEM) photograph of the epitaxial layers produced by the series of crystal growth processes is shown in FIG. 5. Here, in order to evaluate the active layer 107 and the underlying structure, a sample is used in which the p-type GaN layer 108 is not grown, i.e., the growth is stopped after the active layer 107 is formed. The overall thickness is about 1.5 μm. In FIG. 5, black streaky portions are dislocations. For the sake of clarity, a boundary between each portion is indicated by a white dashed line in FIG. 5. The portions defined by the boundaries are a substrate made of silicon, a mask film made of SiO$_2$, a first grown portion obtained using ammonia (seed-GaN), a second grown portion obtained using DMHy (LEG-GaN), and a third grown portion obtained using ammonia (3QW/GaN).

As can be seen from FIG. 5, the seed-GaN is grown from silicon contained in the underlying substrate, and therefore, in the seed-GaN, dislocations extend in a direction perpendicular to the substrate surface. The second grown portion LEG-GaN has an LEG structure obtained using DMHy, and therefore, in the second grown portion LEG-GaN, dislocations extend only in lateral directions, starting from an interface with the seed-GaN. In the third grown portion 3QW/GaN, dislocations are continuously grown upward directly above the seed-GaN. In contrast to this, in the third grown portion 3QW/GaN, substantially no dislocation is observed above the second grown portion LEG-GaN. This may be because the LEG-GaN is selectively grown using DMHy from the side surfaces, and therefore, a dislocation is not present in the vertical direction, and as a result, the 3QW/GaN grown on the LEG-GaN does not have a dislocation. Therefore, the active layer grown on the LEG-GaN has substantially no dislocation, resulting in a high emission efficiency. On the other hand, the active layer grown on the seed-GaN is expected to have numerous through dislocations, resulting in a low emission efficiency.

As can be seen from a right end portion of FIG. 5, there is a white streak (void portion) extending obliquely upward in the mask film made of SiO$_2$. This is because the thermal shrinkage of each crystal growth layer during decreasing of the temperature after the crystal growth is larger than that of the silicon of the underlying substrate, and therefore, a crack is generated in the mask film having the lowest strength by, for example, the LEG-GaN pulling the mask film. This is caused by a considerably high level of adhesion between the buffer layer 103 on the mask film 102 and the LEG layer 105 on the buffer layer 103 of FIG. 2(c), which is achieved irrespective of the selective growth. If the buffer layer 103 is not provided between the mask film 102 and the LEG layer 105, and the mask film 102 and the LEG layer 105 directly contact each other, non-uniform force is applied from the substrate 101 to each crystal growth layer, likely leading to a crack occurring in each crystal growth layer. In other words, as shown in FIG. 2(c), by forming the buffer layer 103 made of AlN on the mask film 102, a crack can be intentionally introduced into the mask film 102, whereby a crack is successfully hindered or prevented from occurring in each crystal growth layer. Moreover, the residual strain of each crystal growth layer can be reduced, whereby carrier separation caused by polarization in the quantum well layers of the active layer 107 can be reduced. Therefore, the emission efficiency can be further increased.

Figure 6:
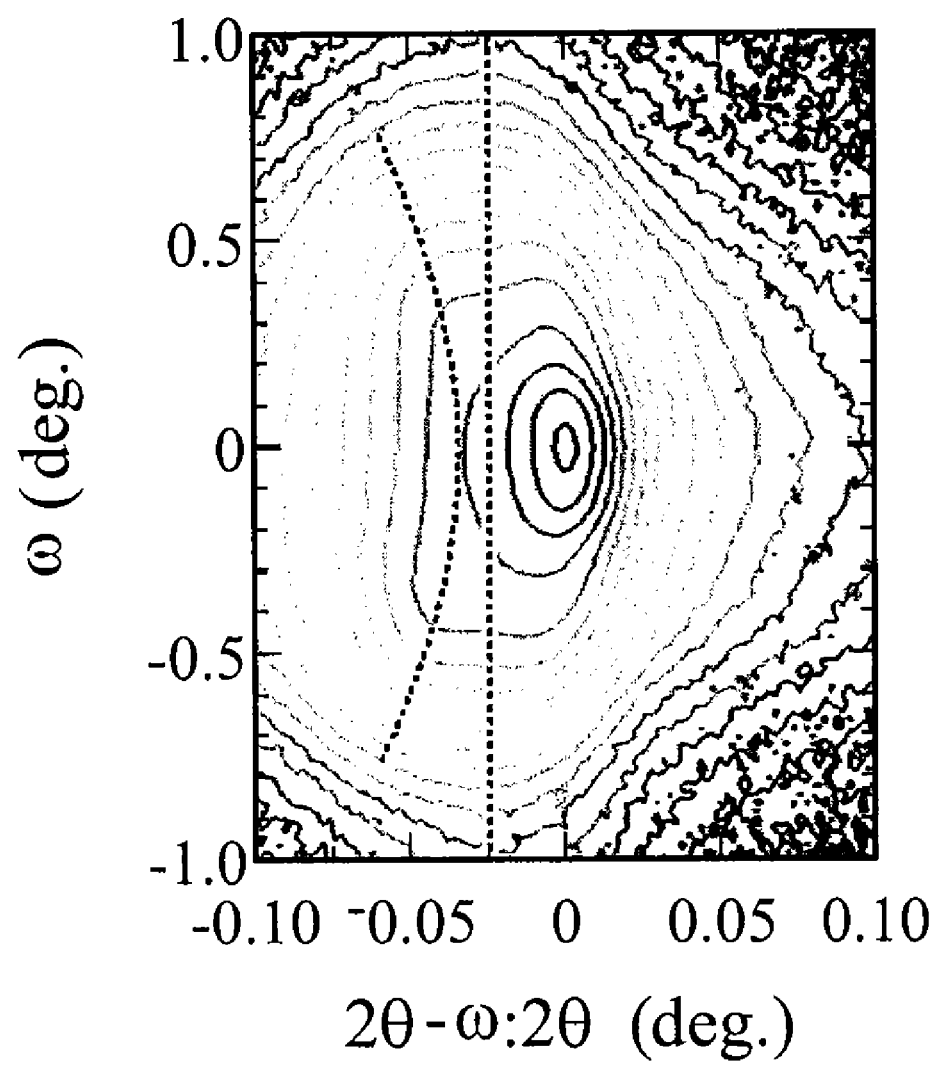
FIG. 6 is a graph showing the result of X-ray diffraction after crystal growth of the third semiconductor layer (active layer) in the nitride semiconductor light-emitting device of the first embodiment of the present invention.

FIG. 6 shows the result of X-ray diffraction conducted after the third grown portion 3QW/GaN is grown as shown in FIG. 5. Here, FIG. 6 shows an enlarged view of a region in the vicinity of the GaN (0002) peak. The vertical and horizontal axes are similar to those of FIGS. 4(a) and 4(b). In FIG. 6, the two small peaks existing in FIG. 4(b) disappear. Instead, the two peaks merges into a single peak having the shape of an ellipse elongated in the vertical direction. This is because the LEG layer 105 obtained using DMHy is pulled by the third grown portion. Because the pulling force is considerably strong, a crack occurs in the mask film 102, resulting in a reduction in the overall residual strain of the crystal growth layers. As described above, however, a large amount of carbon is intentionally incorporated into the LEG layer 105, and therefore, the lattice constant is slightly larger than that at the GaN peak. Therefore, the peak has the shape of an arc extending in the vertical axis direction. Moreover, because the peak has a relatively wide half-width in the ω axis direction, the surface of the n-type GaN layer 106 is slightly sloped on the LEG layer 105.

Figure 7:
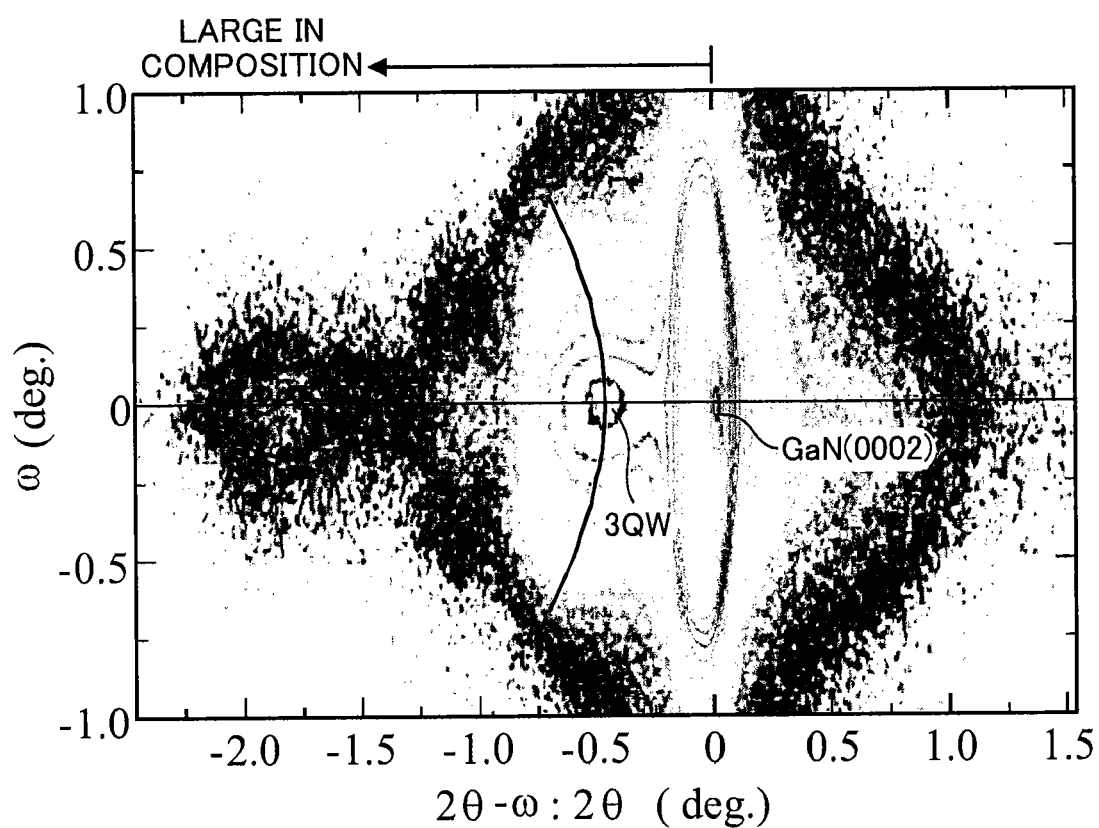
FIG. 7 is a graph showing the result of wide-range X-ray diffraction after crystal growth of the third semiconductor layer (active layer) in the nitride semiconductor light-emitting device of the first embodiment of the present invention.

FIG. 7 shows the result of wide-range X-ray diffraction conducted for a sample in which the third grown portion 3QW/GaN and the preceding layers are grown. In FIG. 7, the highest peak corresponds to the GaN (0002), and extends in the vertical axis direction for the aforementioned reason. In FIG. 7, there are several peaks on the right and left sides of the strong peak caused by the GaN. In particular, at the position of the origin of the 2θ–ω axis, there is a peak in a lower angle region by 0.5 degrees than that of the GaN (0002) peak. This peak corresponds to the zeroth-order diffraction: peak of the quantum well layer made of InGaN, and can be used to calculate that the indium composition is about 8%. On the other hand, as one progresses away from the origin of the ω axis, the zeroth-order diffraction peak of the quantum well layer is shifted to a lower angle region. For example, the shift amount from the GaN (0002) peak is about −0.7 degrees at ±0.5°, which corresponds to an indium composition of about 10%. This may be because, as described above, the surface of the n-type GaN layer 106 on the LEG layer 105 is slightly sloped, and therefore, the efficiency with which indium is incorporated is increased. In other words, it means that a quantum well structure having a high indium composition can be provided irrespective of the growth temperature which is the same as that of the n-type GaN layer 106. Moreover, because the efficiency with which indium is incorporated tends to decrease with an increase in the growth temperature, an InGaN quantum well structure having a high indium composition can be fabricated at relatively high temperature, whereby the active layer 107 having higher crystallinity can be formed by crystal growth.

Figure 8:
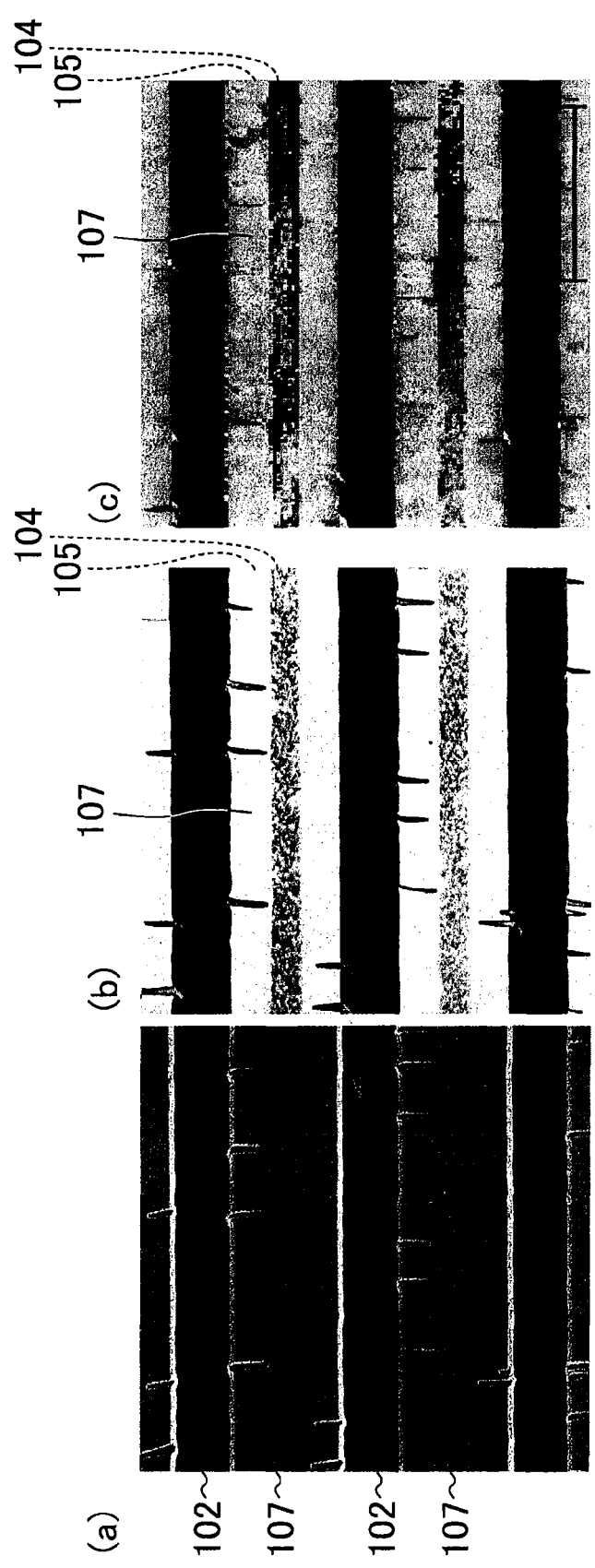
FIGS. 8(a)-8(c) show the results of observation after crystal growth of the third semiconductor layer (active layer) in the nitride semiconductor light-emitting device of the first embodiment of the present invention.

FIG. 8(*a*) shows a top view of a fabricated sample observed using a scanning electron microscope (SEM). The sample is the same as that used in the TEM observation. In FIG. 8(*a*), dark gray portions indicate the mask film 102, and relatively light gray portions indicate the regrown active layer 107. As can be seen from FIG. 8(*a*), the active layer 107 has a perfectly flat surface at the SEM observation level. Moreover, no step or the like is observed even in the junction portion between each crystal growth layer. In general, if a nitride semiconductor is formed, by crystal growth, on a substrate made of silicon without a mask, a crack starts to occur when the thickness is about 0.5 µm. In the present invention, although the overall thickness is about 1.5 µm, no crack is observed in the surfaces of the crystal growth layers. This is because the crystal growth layers are supported by the substrate 101 made of silicon only via the opening 102*a* of the mask film 102, and therefore, the resistance to crack formation is improved. This is also because, as also seen from the TEM observation, a crack is most likely to occur in the mask film 102 than in the other layers.

Next, FIG. 8(*b*) shows the result of measurement of the same region of the sample of FIG. 8(*a*) by cathode luminescence (CL). As can be seen from FIG. 8(*b*), compared to the portion directly above the seed layer 104 of the active layer 107, the entire portion directly above the LEG layer 105 of the active layer 107 emits light. Numerous dark points are observed in the portion directly above the seed layer 104. This may be because of through dislocations extending in the surface of the sample, as can also be observed in the result of TEM observation of FIG. 5. On the other hand, a through dislocation does not exist in the portion directly above the LEG layer 105 of the active layer 107, and therefore, a dark point is not observed in the result of observation by CL, i.e., it is considered that the entire surface emits light.

Next, in order to evaluate the efficiency with which indium (In) is incorporated into the active layer 107, the result of mapping of CL emission peak wavelengths is shown in FIG. 8(*c*). The measured region of the sample is the same as that of FIGS. 8(*a*) and 8(*b*). As can be seen from FIG. 8(*c*), the CL peak wavelength of the portion directly above the seed layer 104 of the active layer 107 is about 390 nm. In contrast to this, the CL peak wavelength of the portion directly above the LEG layer 105 of the active layer 107 is longer by about 20-30 nm than that of the portion directly above the seed layer 104 of the active layer 107. This is because, as described above, the lattice constant is increased due to incorporation of carbon, and the amount of incorporated indium is increased due to the slightly sloped surface of the n-type GaN layer 106. If the indium composition increased by 2%, the emission wavelength is shifted by about 20 nm to a longer wavelength, and the result of X-ray diffraction matches the result of CL. Moreover, as one progresses away from the seed layer 104, the CL peak wavelength of the portion directly above the LEG layer 105 of the active layer 107 is further shifted to a longer wavelength. This may be because the outer portion of the n-type GaN layer 106 has more relaxed strain and a larger lattice constant, and has a sloped surface which facilitates the incorporation of indium compared to the inner surface.

Figure 9:
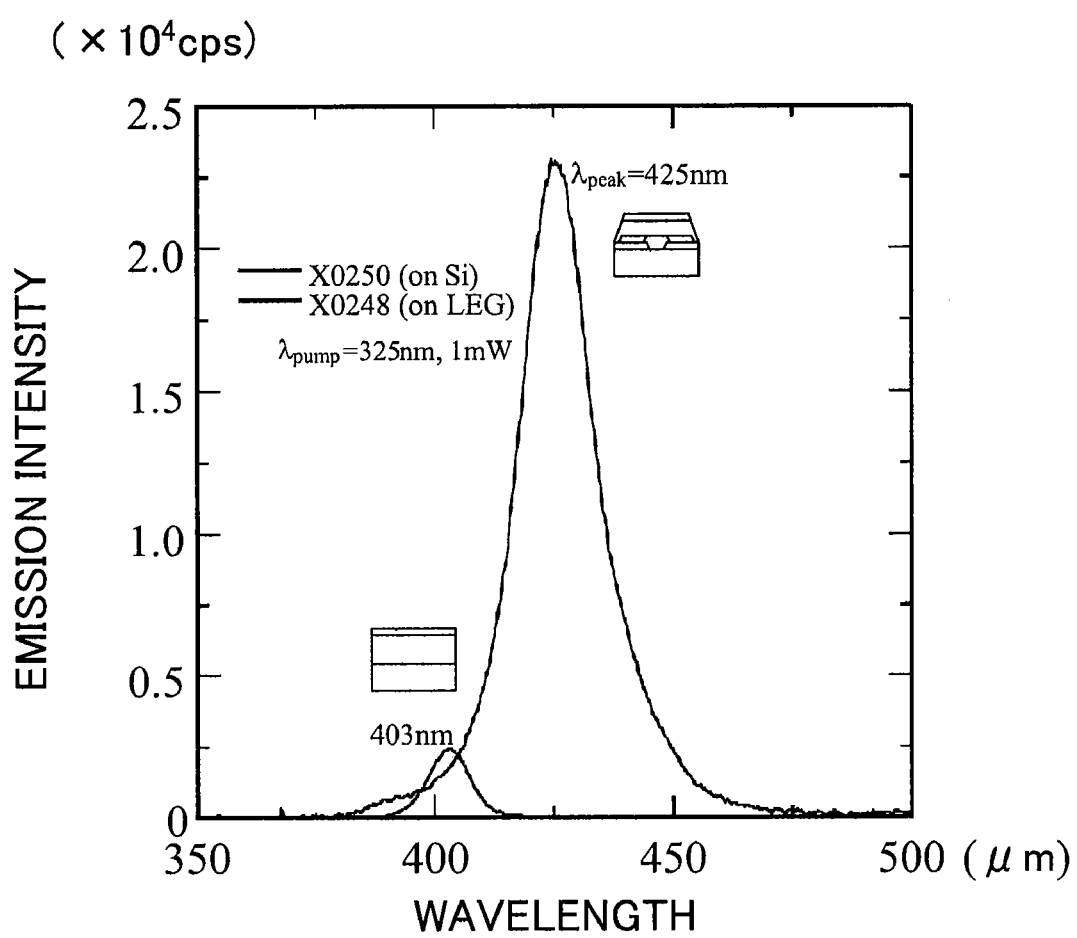
FIG. 9 is a graph showing the result of photoluminescence measurement after crystal growth of the third semiconductor layer (active layer) in the nitride semiconductor light-emitting device of the first embodiment of the present invention, along with a comparative example.

Next, FIG. 9 shows the result of measurement of the emission intensity of the active layer 107 by photoluminescence (PL). As a comparative example, FIG. 9 also shows the result of PL measurement of a quantum well active layer which is formed, by crystal growth, on a substrate made of silicon without using a mask film. Here, the quantum well layer of the comparative example is grown under the same conditions as those for the sample of the present invention. As can be seen from FIG. 9, the sample of the present invention has a PL emission intensity several times as high as that of the comparative example. This may be because dislocations are significantly reduced in the portion directly above the LEG layer 105 of the active layer 107, and therefore, the leakage of carriers via dislocations is significantly reduced. This is also because the active layer 107 of the quantum well structure has a large indium composition, and therefore, the effect of confining carriers by the well layer effectively works. As also described in the result of CL measurement, the sample of the present invention has a PL emission peak wavelength which is significantly shifted to the vicinity of 430 nm compared to the comparative example. This may be because, as described above, the lattice constant is increased due to the incorporation of carbon and the surface of the n-type GaN layer 106 is slightly sloped. In the CL measurement, a region of the active layer 107 directly above the opening 102*a* of the mask film 102 emits light having a wavelength in the vicinity of 390 nm. However, the emission intensity is very weak and therefore is buried by the emission peak of the region directly above the LEG layer 105 of the active layer 107, and therefore, it is not possible to isolate the emission intensity. It is also considered that because the forbidden band of the portion directly above the LEG layer 105 of the active layer 107 is narrower than that of the portion directly above the seed layer 104 of the active layer 107, carries flow and move to the portion directly above the LEG layer 105 of the active layer 107 and contribute to light emission.

The present inventors have thus studied the technique of growing the nitride semiconductor layers of the first embodiment to find the following four features.

(1) The introduction of LEG growth allows the formation of the active layer without a dislocation.

(2) The intentional incorporation of carbon into the LEG grown portion and the slightly sloping of the GaN layer on the LEG grown portion allow an increase in the indium composition of the active layer.

(3) The deposition of AlN on the mask film allows intentional introduction of a crack into the mask film, resulting in the relaxation of strain in the active layer and the reduction of cracks.

(4) If a plurality of nitride semiconductor layers formed on a plurality of openings in the mask film are separated from each other, the thickness of the nitride semiconductor layers can be easily increased, resulting in a dramatic increase in the resistance to crack formation (details thereof will be described later).

As described above, processes are successively performed with respect to the epitaxial structure of FIG. 2(d) having excellent emission efficiency and being free from cracks, whereby a preferred nitride light-emitting diode is obtained.

Figure 3:
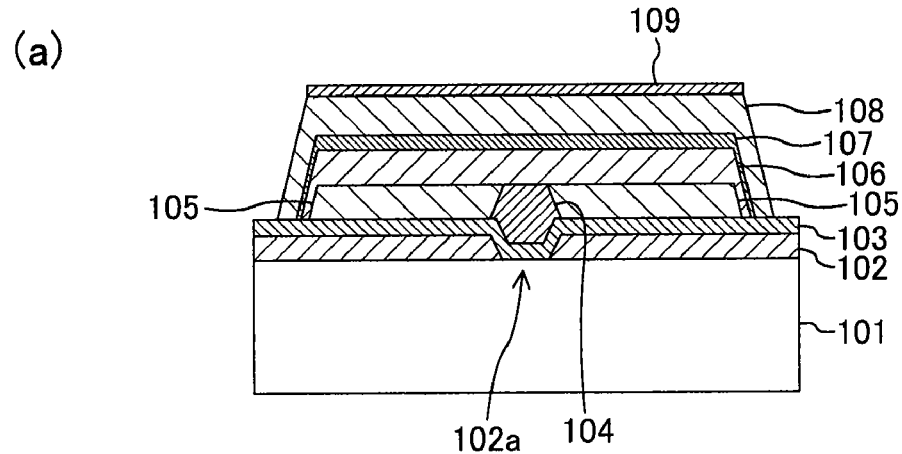
FIGS. 3(a)-3(c) are cross-sectional views for describing the method for fabricating the nitride semiconductor light-emitting device of the first embodiment of the present invention in the order in which the nitride semiconductor light-emitting device is fabricated.
Figure 3:
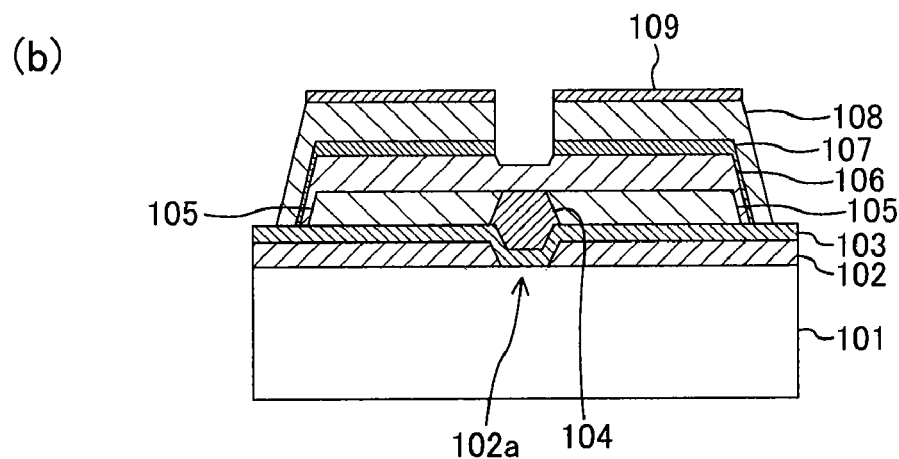
Figure 3:
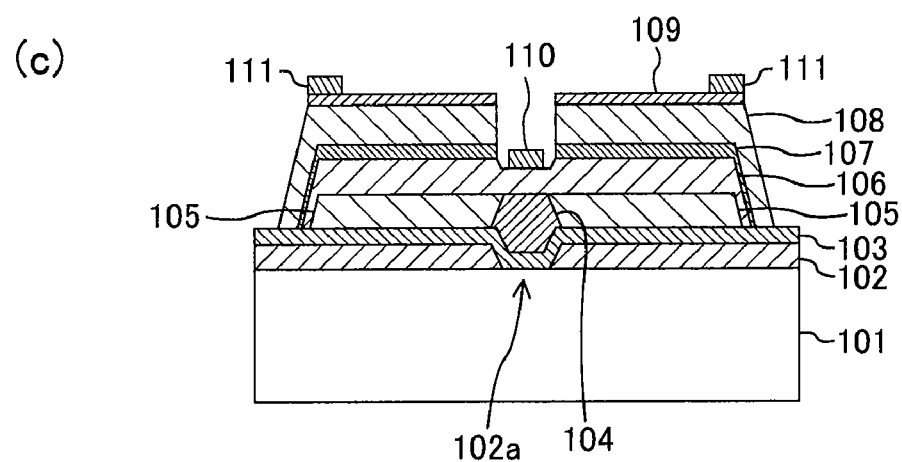

Specifically, as shown in FIG. 3(a), the translucent electrode 109 made of Ni/Au having a thickness of 10 nm or less is formed on the p-type GaN layer 108 by vacuum deposition or sputtering.

Next, as shown in FIG. 3(b), the translucent electrode 109, the p-type GaN layer 108, and the active layer 107 directly above the seed layer 104 are successively etched by an inductively coupled plasma (ICP) etching apparatus which employs chlorine ($Cl_2$) as etching gas, using a resist pattern (not shown) as a mask, to form a hollow portion in which the n-type GaN layer 106 is exposed. Thereafter, annealing is performed in a nitrogen ($N_2$) atmosphere in order to restore the layers which have been damaged by the etching process employing chlorine.

Next, as shown in FIG. 3(c), a resist film (not shown) having an opening pattern in which a region of the translucent electrode 109 outside the hollow portion and a bottom surface of the hollow portion are exposed, is formed by performing resist application, light exposure, and development. Thereafter, a multilayer film made of Ti/Au is formed on the resist film by vacuum deposition or sputtering, and the resist film is then removed by lift-off processing, to form the p-side electrode 111 on the translucent electrode 109, and the n-side electrode 110 on a portion exposed in the hollow portion of the n-type GaN layer 106.

By the aforementioned processes, a high-luminance and high-reliability nitride light-emitting diode can be obtained.

Although the single n-type GaN layer 106 is formed between the active layer 107, and the seed layer 104 and the LEG layer 105 in the first embodiment, a nitride semiconductor layer having a short-period superlattice structure may be formed instead of the single n-type GaN layer 106.

The p-type GaN layer 108 may also be a nitride semiconductor layer having a short-period superlattice structure. In this case, it is possible to further reduce cracks which occur in the nitride semiconductor layer, whereby a thicker film can be grown. In addition, the p-type GaN layer 108 having a short-period superlattice structure has the effect of increasing the rate of activation of acceptors.

Second Embodiment

A second embodiment according to the present invention will be described hereinafter with reference to the drawings.

Figure 10:
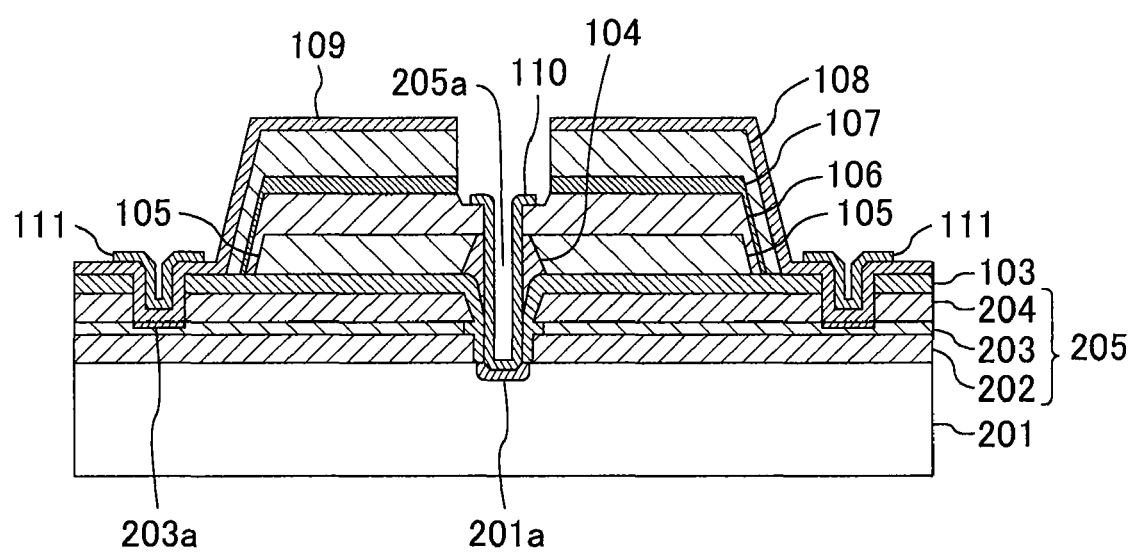
FIG. 10 is a cross-sectional view showing a nitride semiconductor light-emitting device according to a second embodiment of the present invention.

FIG. 10 is a cross-sectional view of a structure of a nitride light-emitting diode in a nitride semiconductor light-emitting device according to the second embodiment of the present invention. In FIG. 10, the same components as those of FIG. 1 are indicated by the same reference characters.

The nitride light-emitting diode of FIG. 10 is a nitride blue light-emitting diode employing a hexagonal-system GaN-based semiconductor and having an emission wavelength of 450 nm.

As shown in FIG. 10, a mask film 205 having an opening 205a and including a first insulating film 202, a conductive film 203, and a second insulating film 204 is formed on a principal surface having a plane orientation (111) (i.e., a (111) plane) of a substrate 201 made of n-type silicon (Si). Thus, the mask film 205 of the second embodiment has a multilayer structure in which the conductive film 203 is sandwiched between the first insulating film 202 and the second insulating film 204. Here, for example, the first insulating film 202 is made of $SiO_2$ having a thickness of 100 nm, the conductive film 203 is made of n-type polysilicon having a thickness of 100 nm, and the second insulating film 204 is made of $SiO_2$ having a thickness of 300 nm.

As shown in FIG. 10, in the nitride light-emitting diode of the second embodiment, the conductive film 203 is formed inside the mask film 205. Therefore, by electrically connecting an end portion of the translucent electrode 109 to the conductive film 203 of the mask film 205, the p-side electrode 111 can be formed on the mask film 205. Therefore, the p-side electrode 111 no longer needs to be provided on the p-type GaN layer 108, whereby the electrode pad can be highly flexibly disposed without sacrificing the area of the p-type GaN layer 108 through which emission light is transmitted.

Moreover, in the second embodiment, the n-side electrode 110 is also electrically connected to the substrate 201 by penetrating through the opening 205a of the mask film 205 in the seed layer 104 and the buffer layer 103. Note that, here, a titanium silicide layer 201a is formed in a junction portion with the substrate 201 of the n-side electrode 110, and a nickel silicide layer 203a is formed in a junction portion with the conductive film 203 of the p-side electrode 111.

A method for fabricating the nitride light-emitting diode thus configured will be described hereinafter with reference to the drawings.

FIGS. 11(a)-11(d) and 12(a)-12(d) are cross-sectional views for describing the method for fabricating the nitride light-emitting diode of the second embodiment of the present invention in the order in which the nitride light-emitting diode is fabricated.

Figure 11:
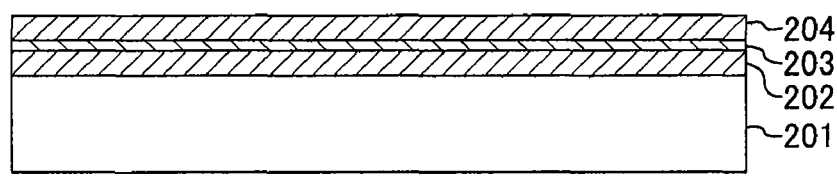
FIGS. 11(a)-11(d) are cross-sectional views for describing a method for fabricating the nitride semiconductor light-emitting device of the second embodiment of the present invention in the order in which the nitride semiconductor light-emitting device is fabricated.
Figure 11:
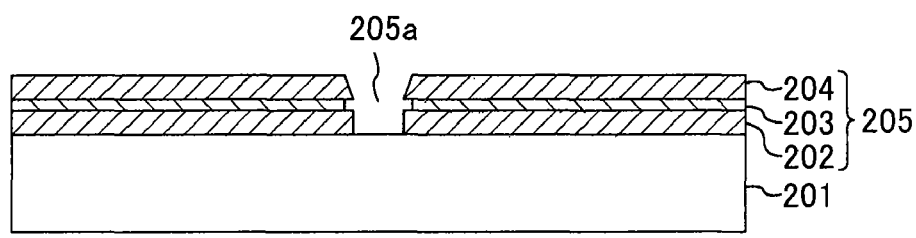
Figure 11:
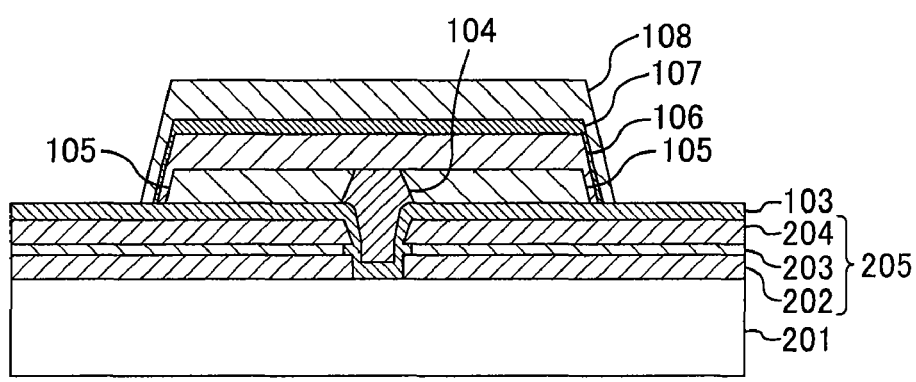
Figure 11:
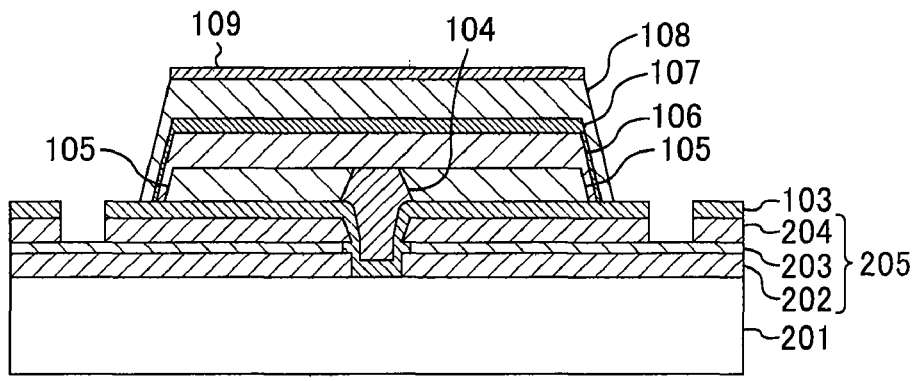

Initially, as shown in FIG. 11(a), the first insulating film 202 made of a $SiO_2$ film having a thickness of 100 nm is formed, by thermal oxidation, on the principal surface having a plane orientation (111) of the substrate 201 made of n-type silicon. Next, the conductive film 203 made of n-type polysilicon doped with phosphorus (P) as an n-type impurity is formed on the first insulating film 202 by chemical vapor deposition using silane gas. Next, the second insulating film 204 made of a $SiO_2$ film having a thickness of 100 nm is formed on the conductive film 203 by plasma enhanced chemical vapor deposition (p-CVD).

Figure 12:
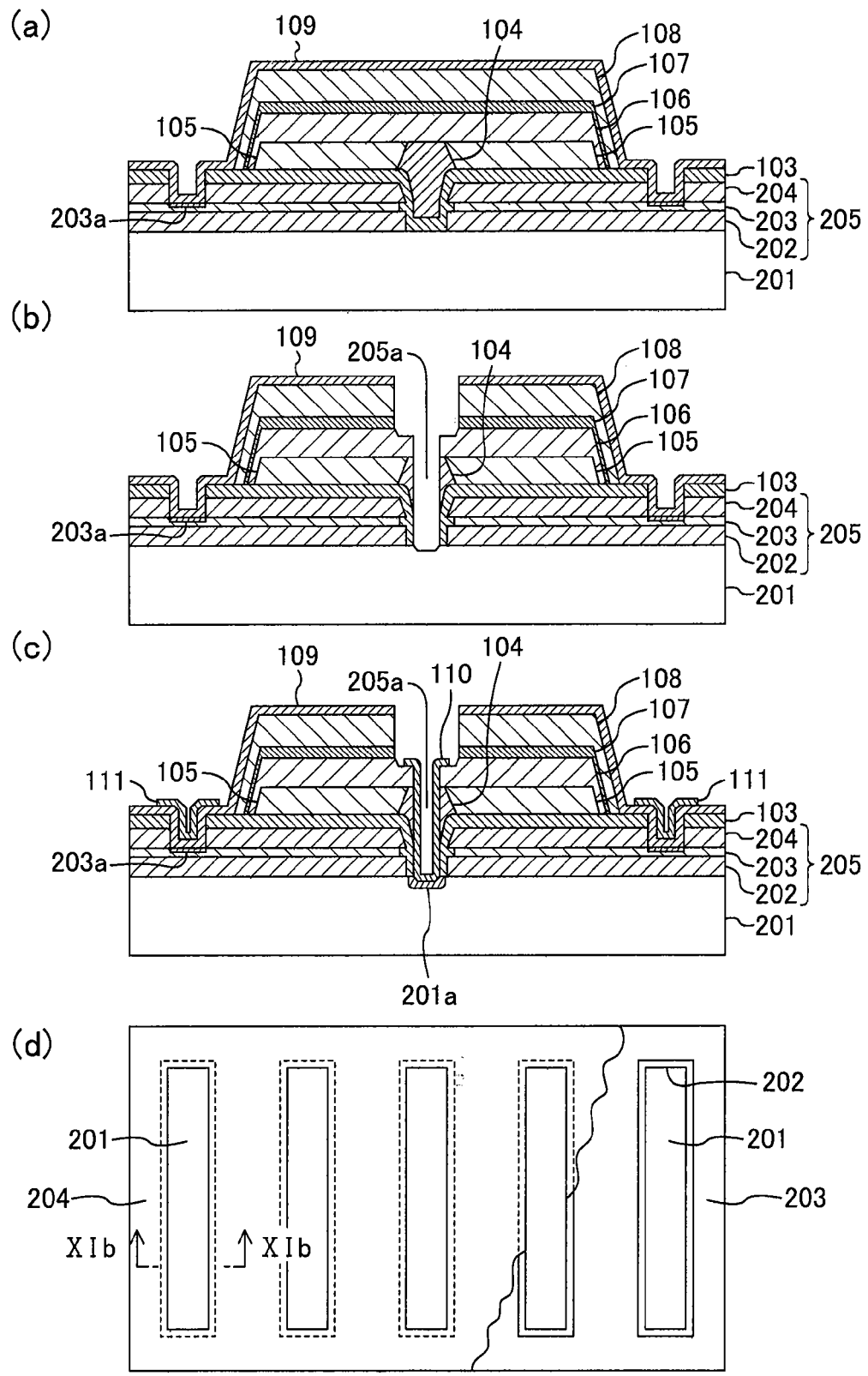
FIGS. 12(a)-12(d) are cross-sectional views for describing the method for fabricating the nitride semiconductor light-emitting device of the second embodiment of the present invention in the order in which the nitride semiconductor light-emitting device is fabricated.

Next, although not shown, a resist pattern is formed on the second insulating film 204 by resist application, light exposure, and development, and the formed resist pattern is used to form the mask film 205 having the opening 205a and including the second insulating film 204, the conductive film 203, and the first insulating film 202 as shown in FIG. 11(b). Specifically, initially, an opening pattern is transferred to the second insulating film 204 by reactive ion etching using $CF_4$-based gas (etching gas containing $CF_4$ as a component). Next, an opening pattern is also transferred to the conductive film 203 by dry etching using chlorine-based gas. Next, an undercut having a width (depth) of 40 nm or more is formed in an exposed portion of the sidewall of the opening 205a of the conductive film 203 using aqua regia. The undercut is provided in order to hinder or prevent aluminum nitride (AlN) which will constitute the buffer layer 103 in a subsequent step from extraordinarily growing from the (111) plane which is an exposed surface of the opening 205a of the conductive film 203 to have an adverse influence on the buffer layer 103 grown from the substrate 201. Next, again, an opening pattern is transferred to the first insulating film 202 by $CF_4$-based reactive ion etching, and then the resist pattern is removed using an organic solvent. Thus, the mask film 205 having the opening 205a with excellent reproducibility can be formed using dry etching and wet etching. FIG. 12(d) is a plan view of a structure of the conductive film 203 of FIG. 11(b). FIG. 11(b) is a cross-sectional view taken along line XIb-XIb of FIG. 12(d). As shown in FIG. 12(d), regions having the shape of a rectangle as viewed from the top are exposed portions of the substrate 201 which is an underlying layer. A right portion of the figure shows the conductive film 203 having an undercut, where the second insulating film 204 is imaginarily removed. As shown in FIG. 12(d), only the first insulating film 202 and the second insulating film 204 are provided between the exposed substrate 201 and conductive film 203 having the shape of a rectangle because of the undercut in which the conductive film 203 is removed. Note that, as can be seen from FIG. 12(d), the conductive film 203 is continuously formed on an entire surface of the substrate 201. This is for the purpose of using the conductive film 203 as interconnects and the like for electricity conduction as described below.

Next, as shown in FIG. 11(c), as in the first embodiment, the buffer layer 103 made of AlN, the seed layer 104 made of n-type GaN, the LEG layer 105 formed using DMHy, the n-type GaN layer 106, the active layer 107 made of InGaN, and the p-type GaN layer 108 are successively grown (crystal growth) on the mask film 205 including the opening 205a by MOCVD. Note that, in the second embodiment, the seed layer 104 is doped with silicon to have the n-type conductivity, taking into consideration the n-side electrode 110 which will be formed in a subsequent step. Also in the LEG layer 105, as in the first embodiment, substantially no dislocation occurs in the active layer 107 grown directly above the LEG layer 105, and a crack is not present in the entire surface of each crystal growth layer made of a nitride semiconductor.

Next, as shown in FIG. 11(d), a resist film (not shown) having opening patterns in the buffer layer 103 on right and left sides of the p-type GaN layer 108 is formed by resist application, light exposure, and development. Next, the buffer layer 103 and the second insulating film 204 are hollowed by ICP dry etching using the formed resist film as a mask to expose the conductive film 203 therebelow.

Next, as shown in FIG. 12(a), after the resist film is removed, the translucent electrode 109 made of Ni/Au is formed by deposition, and predetermined annealing is then performed. As a result, the electrical resistance between the p-type GaN layer 108 and the translucent electrode 109 is reduced, and the nickel silicide layer 203a is formed between the conductive film 203 constituting the mask film 205 and the translucent electrode 109. As a result, the electrical resistance at a junction portion between the conductive film 203 and the translucent electrode 109 can be reduced.

Next, as shown in FIG. 12(b), a resist film (not shown) having an opening pattern directly above the seed layer 104 is formed on the translucent electrode 109 by resist application, light exposure, and development. Next, portions directly above the seed layer 104 of the p-type GaN layer 108 and the active layer 107, which have a lower emission efficiency due to dislocations, are etched by ICP dry etching using the resist film as a mask. Moreover, the n-type GaN layer 106 and the seed layer 104 are etched so the substrate 201 is exposed.

Next, as shown in FIG. 12(c), the n-side electrode 110 and the p-side electrode 111 each made of Ti/Au are formed by lift-off processing. Also, here, even if the p-side electrode 111 is made of the same material as that for the n-side electrode 110 as in the first embodiment, the resistance between the translucent electrode 109 and the p-side electrode 111 can be reduced, and therefore, the same material is used for the purpose of ease of the process. Thereafter, the n-side electrode 110 and the p-side electrode 111 thus formed are annealed to cause a junction portion between the n-side electrode 110 and the substrate 201 to be titanium silicide 201a, whereby the substrate 201 is used as an electrode pad for the n-side electrode 110.

Thus, in the second embodiment, the p-side electrode 111 is not formed on the p-type GaN layer 108 located on the active layer 107. As a result, compared to the case where the p-side electrode 111 is formed on the p-type GaN layer 108, the area through which emission light of the active layer 107 can be extracted can be increased.

Moreover, the conductive film 203 made of n-type polysilicon is provided in an entire inner portion of the mask film 205, whereby the p-side electrode 111 can be highly flexibly disposed. Therefore, the p-side electrode pad can be disposed with a high level of flexibility without the p-side electrode 111 sacrificing the area through which emission light is extracted. As a result, a high-luminance and high-reliability nitride light-emitting diode can be provided.

Although the conductive film 203 made of n-type polysilicon constituting the mask film 205 is formed by vapor deposition in the second embodiment, the advantages of the present invention are not impaired even if a silicon-on-insulator (SOI) substrate is employed.

Moreover, although the n-side electrode 110 is connected to the substrate 201 made of n-type silicon, the n-side electrode 110 may be connected to the surface of the n-type GaN layer 106 as in the first embodiment, and even in this case, the advantages of the present invention can be sufficiently achieved.

Variation of Second Embodiment

A variation of the second embodiment of the present invention will be described hereinafter with reference to the drawings.

Figure 13:
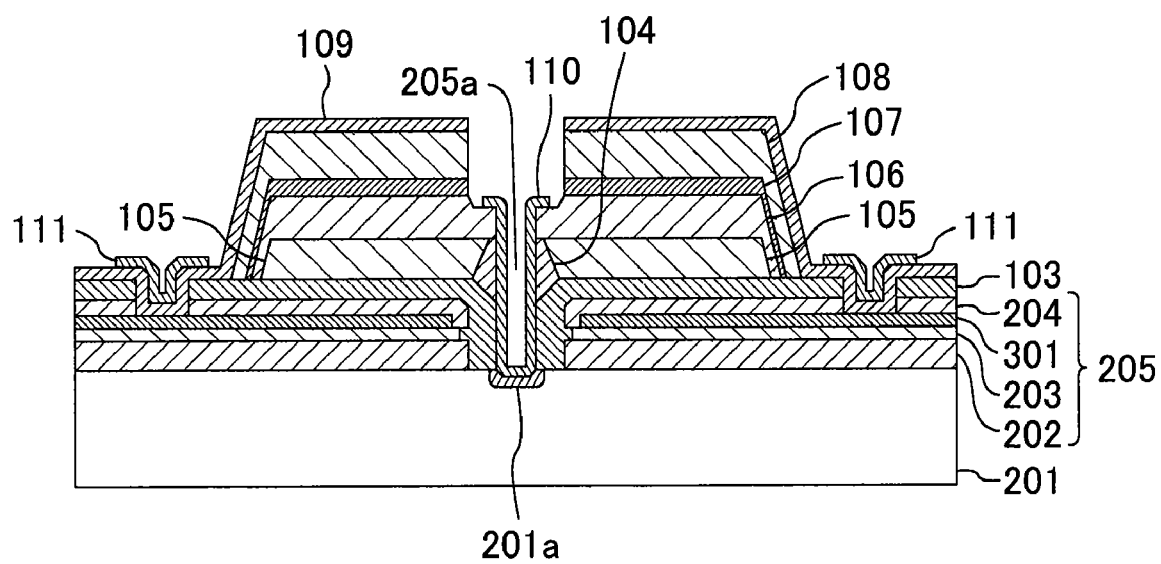
FIG. 13 is a cross-sectional view showing a nitride semiconductor light-emitting device according to a variation of the second embodiment of the present invention.

FIG. 13 is a cross-sectional view of a structure of a nitride light-emitting diode in a nitride semiconductor light-emitting device according to the variation of the second embodiment of the present invention. In FIG. 13, the same components as those of FIG. 10 are indicated by the same reference characters.

As shown in FIG. 13, in the mask film 205, a reflective film 301 made of rhodium (Rh) having a thickness of 50 nm is provided between the conductive film 203 made of n-type polysilicon and the second insulating film 204 made of SiO$_2$.

Rhodium has a reflectance of about 75% with respect to blue light, which is about 1.6 times as high as the reflectance of silicon, which is 46%. Rhodium also has a melting point of 2000° C. or more and does not react with silicon, and therefore, is an optimum metal material. Here, the conductive film 203 made of n-type polysilicon is introduced in order to reduce the deformation of the reflective film 301 in a thermal treatment and enhance the adhesion with the first insulating film 202.

A pad region for the p-side electrode 111 is formed by the translucent electrode 109 made of Ti/Au and the reflective film 301 made of Rh contacting each other outside the p-type GaN layer 108. Therefore, in this variation, a silicide layer is not formed in the pad region.

A method for fabricating the nitride light-emitting diode thus configured will be described hereinafter with reference to the drawings.

FIGS. 14(a)-14(d) are cross-sectional views for describing the method for fabricating the nitride light-emitting diode of the variation of the second embodiment of the present invention in the order in which the nitride light-emitting diode is fabricated.

Figure 14:
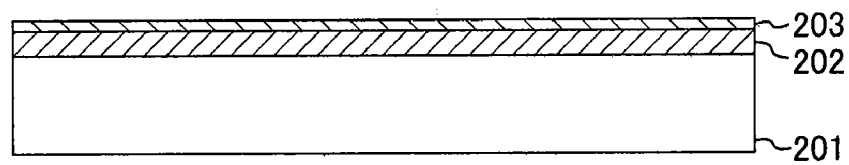
FIGS. 14(a)-14(d) are cross-sectional views for describing a method for fabricating the nitride semiconductor light-emitting device of the variation of the second embodiment of the present invention in the order in which the nitride semiconductor light-emitting device is fabricated.
Figure 14:
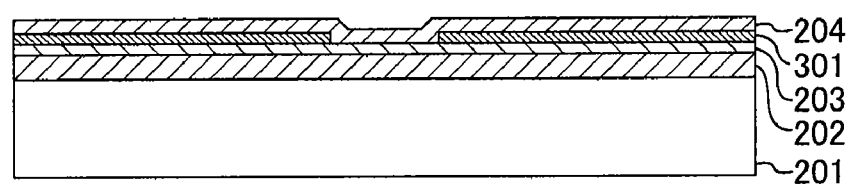
Figure 14:
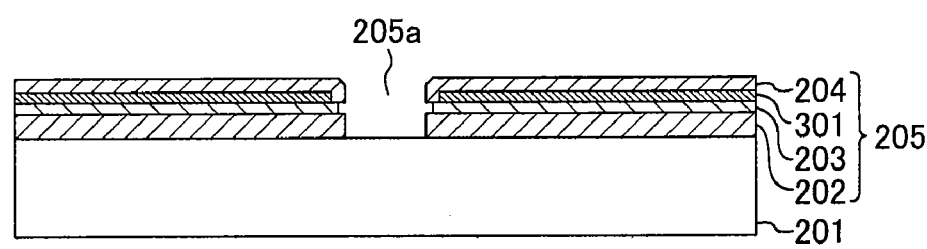
Figure 14:
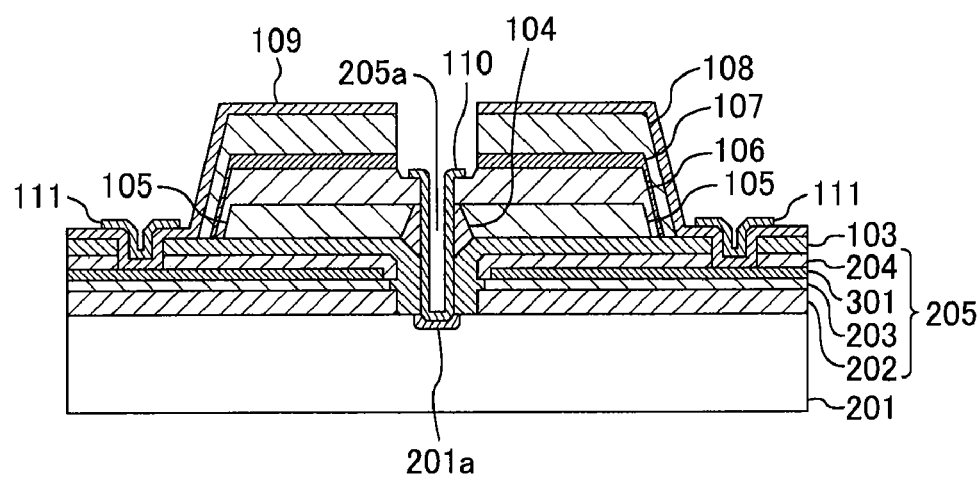

Initially, as shown in FIG. 14(a), the first insulating film 202 made of a SiO$_2$ film having a thickness of 100 nm is formed, by thermal oxidation, on a principal surface having a plane orientation (111) (i.e., a (111) plane) of the substrate 201 made of n-type silicon, and the conductive film 203 made of n-type polysilicon is then formed on the first insulating film 202.

Next, as shown in FIG. 14(b), a resist film (not shown) having a mask pattern which covers the opening 205a is formed on the conductive film 203 by resist application, light exposure, and development. Next, a rhodium film having a thickness of 50 nm is deposited over an entire surface of the conductive film 203 including the resist film by vacuum deposition, and thereafter, the reflective film 301 having an opening pattern is formed from the rhodium film by lift-off processing which removes the resist film. Next, the second insulating film 204 made of a SiO$_2$ film having a thickness of 100 nm is formed on the reflective film 301 having the opening pattern by plasma enhanced chemical vapor deposition.

Next, as shown in FIG. 14(c), as in the second embodiment, the mask film 205 having the opening 205a at a center portion of the opening pattern of the reflective film 301 is formed by reactive ion etching and wet etching.

Next, as shown in FIG. 14(d), as in the second embodiment, the buffer layer 103 made of AlN, the seed layer 104 made of n-type GaN, the LEG layer 105 formed using DMHy, the n-type GaN layer 106, the active layer 107 made of InGaN, and the p-type GaN layer 108 are successively grown (crystal growth) on the mask film 205 having the opening 205a by MOCVD. In this case, because rhodium constituting the reflective film 301 is considerably chemically stable, the reflective film 301 is not damaged by ammonia or the like even during the crystal growth.

Next, the p-side electrode 111 is formed to be connected to the translucent electrode 109 and the reflective film 301 outside the p-type GaN layer 108. Thereafter, a hole penetrating from the p-type GaN layer 108 to the buffer layer 103 which are located directly above the opening 205a of the mask film 205 is formed to expose the substrate 201, and the n-side electrode 110 is formed to electrically connect the n-type GaN layer 106 and the exposed portion of the substrate 201.

As described above, in this variation, because the reflective film 301 made of rhodium having a high reflectance is provided on the mask film 205, light emitted toward the substrate 201 by the active layer 107 is reflected from the reflective film 301 and travels upward, i.e., in a direction away from the substrate 201. There are several advantages when the reflective film 301 is made of a metal. Firstly, when the metal is a noble metal, such as rhodium (Rh) or the like, there is not a degradation over time. Moreover, because of the conductivity, the reflective film 301 can be used to flow a current instead of the conductive film 203 made of n-type polysilicon. Metals have higher conductivities than that of polysilicon and therefore can reduce the drive voltage and the heat generation.

When the mask film 205 is a dielectric multilayer reflective film including a plurality of dielectric films, then if the incident direction of light is offset from the designed angle of the dielectric multilayer reflective film, the designed reflectance cannot be obtained. Therefore, when reflectances are averaged over all incident directions of light, it is not actually possible to obtain a very high overall reflectance. In contrast to this, when the reflective film 301 is made of a metal, there is not the dependence of the angle of incidence on the reflectance. For example, when made of rhodium, the reflective film 301 has a reflectance of about 75 for all directions. Moreover, in this case, even when averaged over all incident directions, the reflectance is still about 75%, and therefore, the overall reflectance is higher than that of the dielectric multilayer reflective film.

Thus, by forming the reflective film 301 made of a metal inside the mask film 205, the light extraction efficiency can be improved, resulting in a high-luminance and high-reliability nitride light-emitting diode.

Although the reflective film 301 is provided on the entire surface of the mask film 205 except for the opening 205a in this variation, it is not always necessary to do so, i.e., the advantages of the present invention can be obtained if the reflective film 301 is provided in at least a region directly below the active layer 107. Moreover, when it is not the entire surface on which the reflective film 301 is provided, there is also the advantage of reducing thermal stress caused by the metal constituting the reflective film 301.

Although the reflective film 301 is made of rhodium (Rh) in this variation, a silver-palladium (AgPd) alloy may be used instead of rhodium. Silver itself has a reflectance of as high as 90% or more with respect to blue light, however, its melting point is disadvantageously low. In contrast to this, a silver alloy containing about 50% palladium can have an increased melting point of up to about 1300° C., and therefore, can be used as a reflective material capable of resisting crystal growth of a nitride semiconductor. Note that because palladium has a reflectance of about 64% with respect to blue light, the silver-palladium alloy has a reflectance of about 70%, which is lower than that of silver itself. This reflectance value is substantially equal to that of rhodium. The silver palladium alloy is also capable of being etched with aqua regia or the like, and therefore, there are advantageously an increased number of options for forming an opening pattern, such as wet etching and the like, in addition to lift-off processing.

Third Embodiment

A third embodiment of the present invention will be described hereinafter.

Firstly, a relationship between a substrate made of silicon (Si) and cracks occurring in a nitride semiconductor layer grown on the substrate will be described based on the results of experiments conducted by the present inventors.

As described above, when a nitride semiconductor is formed, by crystal growth, on a silicon substrate, then if the grown nitride semiconductor has a relatively large thickness, a crack occurs. In particular, the threshold thickness is about 0.5 μm, and if the thickness exceeds that value, the number of cracks sharply increases. The present inventors specifically studied cracks occurring in the surfaces of samples in which gallium nitride (GaN) having a thickness of 1.2 μm was formed on a silicon substrate.

If cracks occur in the surface of the grown sample, the sample surface is divided into a large number of small pieces. The small pieces have the shape of an equilateral triangle, a parallelogram, a trapezoid, or the like as viewed from the top, depending on the cracks. Moreover, the nitride semiconductor has six-fold symmetry in a plane having a plane orientation (0001) (i.e., a (0001) plane), and therefore, each vertex has an angle close to 60° or 120°. Here, for each small piece, the length "a" of the longest side and the length "b" of a side adjacent to the longest side were measured. Therefore, a=b means an equilateral triangle, and a>b means a parallelogram or a trapezoid. Parallelograms were considered as trapezoids having the same area and perimeter and were counted as trapezoids.

Figure 15:
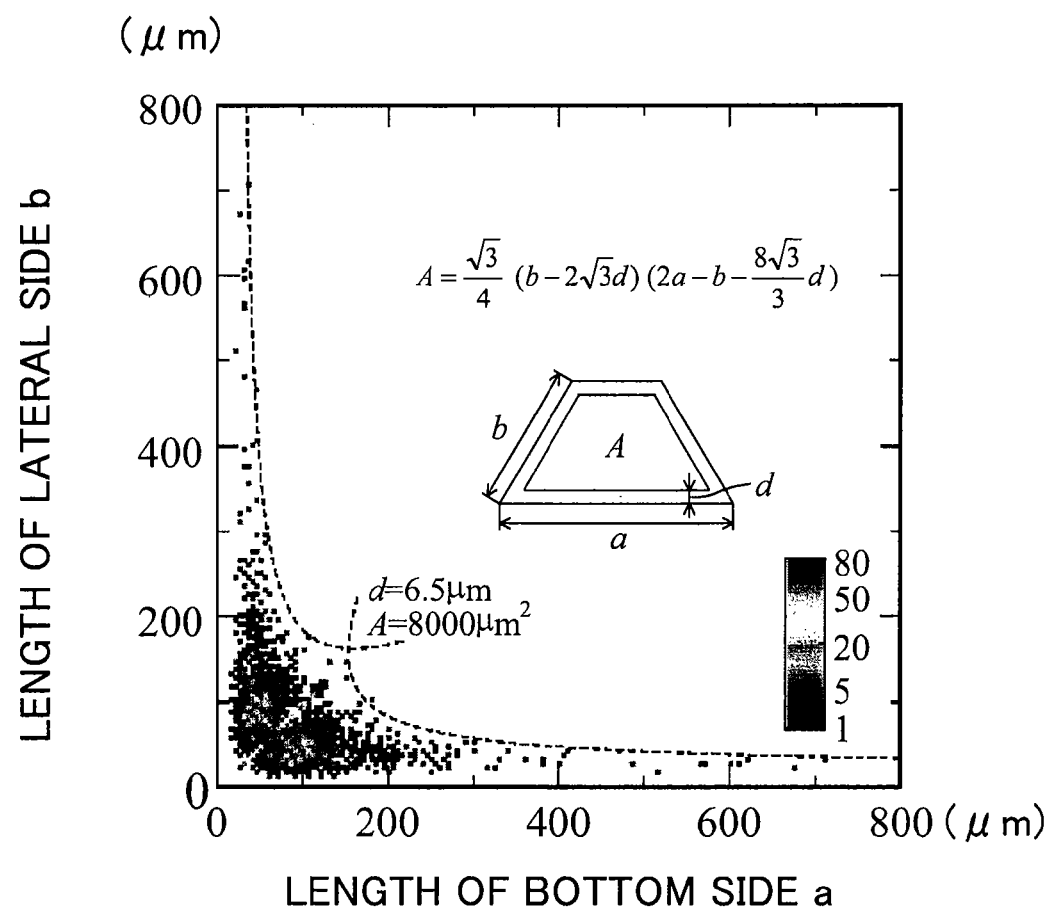
FIG. 15 is a graph showing a relationship between sizes and a distribution of small pieces generated by cracks occurring in a nitride semiconductor grown on a silicon substrate in a third embodiment of the present invention.

FIG. 15 shows a distribution of the small pieces having the sides "a" and "b." For ease of understanding, FIG. 15 also shows a distribution where "a" and "b" are switched (a mirror image with respect to a straight line a=b). As can be seen from FIG. 15, there are a considerably large number of small pieces having the shape of an equilateral triangle (a=b), and there are also a large number of small pieces having sizes close to those of the equilateral triangular pieces. On the other hand, there are also small pieces whose long sides are considerably long, e.g., several hundreds of micrometers.

Here, as shown in an additional drawing in FIG. 15, the area "A" of an inner portion of a trapezoid which is obtained by cutting a margin having a width "d" from the circumference is calculated by simple geometrical calculation as follows.

$$A = \frac{\sqrt{3}}{4}(b - 2\sqrt{3}d)\left(2a - b - \frac{8\sqrt{3}}{3}d\right) \quad (1)$$

Here, if the area "A" and the margin width "d" are regarded as parameters, Expression 1 can be regarded as a relational expression of "a" and "b." A relationship between "a" and "b" which covers the maximum values of the distribution of FIG. 15, where "A" and "d" of Expression 1 take various values, is represented by a curve indicated by a dashed line in FIG. 15. In this case, "A" and "d" are 8000 μm² and 6.5 μm, respectively. Thus, the maximum values of the distribution of the small pieces can be calculated based on the geometrical relationship given by Expression 1. Moreover, when one of the sides has a length of 13 μm or less, the area "A" has a negative value. This means that there is not a crack. This may be why some small pieces which are considerably long and narrow are observed, particularly in FIG. 15.

This is physically interpreted as follows.

Firstly, the margin "d" is a region adjacent to a crack. Therefore, it is considered that the residual strain between silicon and the nitride semiconductor is substantially eliminated. In other words, the margin "d" corresponds to a region in which the residual strain is eliminated due to a crack. On the other hand, the portion excluding the margin "d" of the area "A" is located inside the sides of the area "A", and therefore, the residual strain is maintained. Moreover, the fact that the remaining region of the area "A" limits the maximum size of a small piece, means that there is a limit value of residual strain energy for the existence of a small piece. Moreover, as the growth thickness increases, the value of the area "A" tends to inverse-proportionally decrease, resulting in an increase in the number of small pieces having smaller areas. On the other hand, the margin "d" does not seem to be much changed even when the growth thickness increases.

As described above, it can be seen that the growth thickness has a limit value for the existence of a small piece. Moreover, when a nitride semiconductor is grown into an island shape on a silicon substrate, and a light-emitting device is formed in the island-shaped grown nitride semiconductor, the light-emitting device needs not to exceed the area "A." Incidentally, a typical light-emitting device has a minimum chip size of about 200 μm×200 μm for ease of handling. In this case, the chip area is 40000 μm², and therefore, the thickness is permitted to be only up to several hundreds of nanometers in order to prevent a crack. If a blue-violet laser diode is fabricated on a silicon substrate, a larger thickness is required to obtain the stability of the beam shape and reduce or avoid interference by the underlying substrate. This holds true for light-emitting diodes (LEDs). It is necessary to provide a certain thickness, taking it into consideration that the n-side electrode is formed by hollowing from the top layer to the n-type GaN layer located below the active layer. As described above, however, the area "A" limits the maximum size of small pieces, and therefore, it is necessary to employ a device structure in which a plurality of light-emitting elements are formed on a single chip.

Based on the aforementioned experimental results and discussion relating to cracks, a light-emitting diode which is an example nitride semiconductor light-emitting device according to the present invention will be described with reference to the drawings.

In particular, in this embodiment, a method of efficiently connecting a plurality of light-emitting elements will be described using a silicon-on-insulator (SOI) substrate, in addition to the addition of a function to the mask film formed on the substrate as in the second embodiment.

Figure 16:
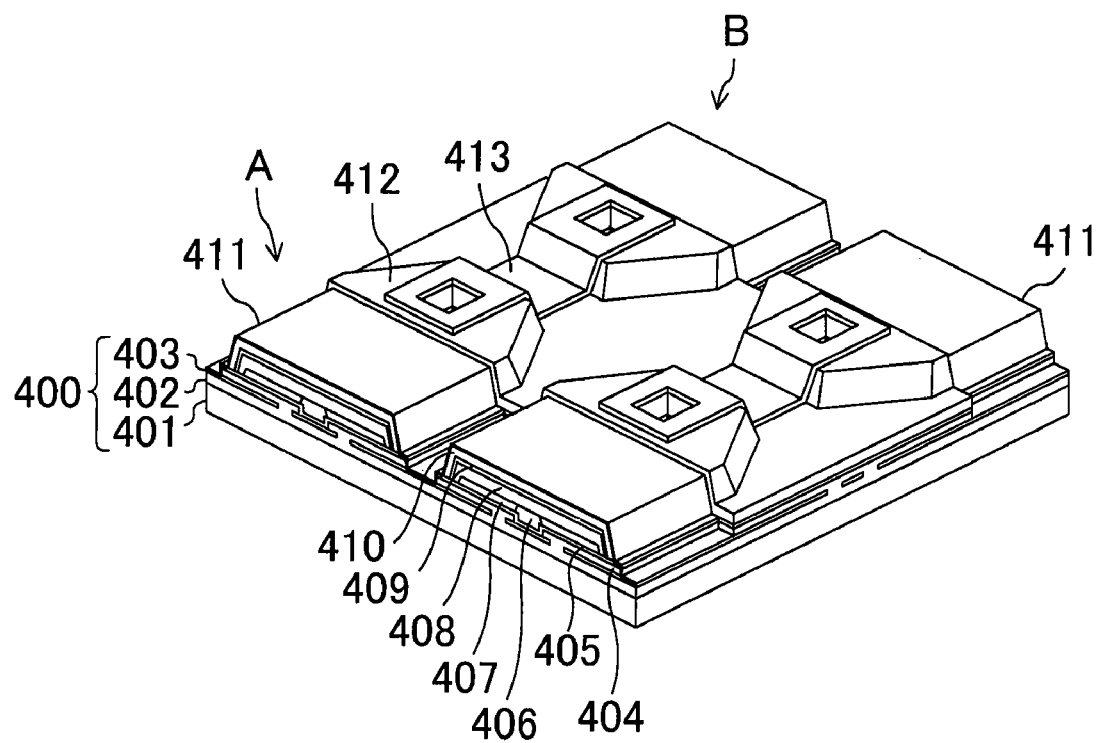
FIG. 16 is a perspective view showing a nitride semiconductor light-emitting device according to the third embodiment of the present invention.

FIG. 16 shows a nitride light-emitting diode which is a nitride blue light-emitting diode including a hexagonal-system GaN-based semiconductor and having an emission wavelength of 450 nm, and includes two pairs of elements, each pair including, for example, an element A and an element B.

The light-emitting diode of the third embodiment includes an SOI substrate 400 including an Si substrate (underlying layer) 401, an insulating layer 402, and an Si thin layer 403 made of highly-doped n-type silicon and having a plane orientation (111).

Here, as described below, the Si thin layer 403 is patterned to have a first pattern which is to serve as seed crystal for a seed layer 406 made of GaN, a second pattern which is to be connected to a p-side electrode 411, and a third pattern which is to be connected to an n-side electrode 413 with an insulating film 412 being interposed therebetween.

For example, in the element A, a mask film 404 made of SiO₂ and having an opening which exposes the first pattern of the Si thin layer 403 is formed on the Si thin layer 403. On the mask film 404 including the opening, a buffer layer 405 made of AlN, the seed layer 406 made of GaN, an LEG layer 407 on a side surface of the seed layer 406, and an n-type GaN layer 408, an active layer 409, and a p-type GaN layer 410 on the seed layer 406 and the LEG layer 407, are successively formed by crystal growth.

In a portion excluding the insulating film 412 of the upper surface of the p-type GaN layer 410, the p-side electrode 411 made of Ni/Au is formed in a region outside the p-type GaN layer 410 so that the p-side electrode 411 is electrically connected to the second pattern of the Si thin layer 403. The n-side electrode 413 penetrates the insulating film 412, the p-type GaN layer 410, and the active layer 409 to be electrically connected to the n-type GaN layer 408 below the active layer 409, and is shared by a pair of the elements A and B.

A method for fabricating the nitride light-emitting diode thus configured will be described with reference to the drawings.

FIGS. 17(a)-17(c) and 18(a)-18(c) are cross-sectional views for describing the method for fabricating the nitride light-emitting diode of the third embodiment of the present invention in the order in which the nitride light-emitting diode is fabricated.

Figure 17:
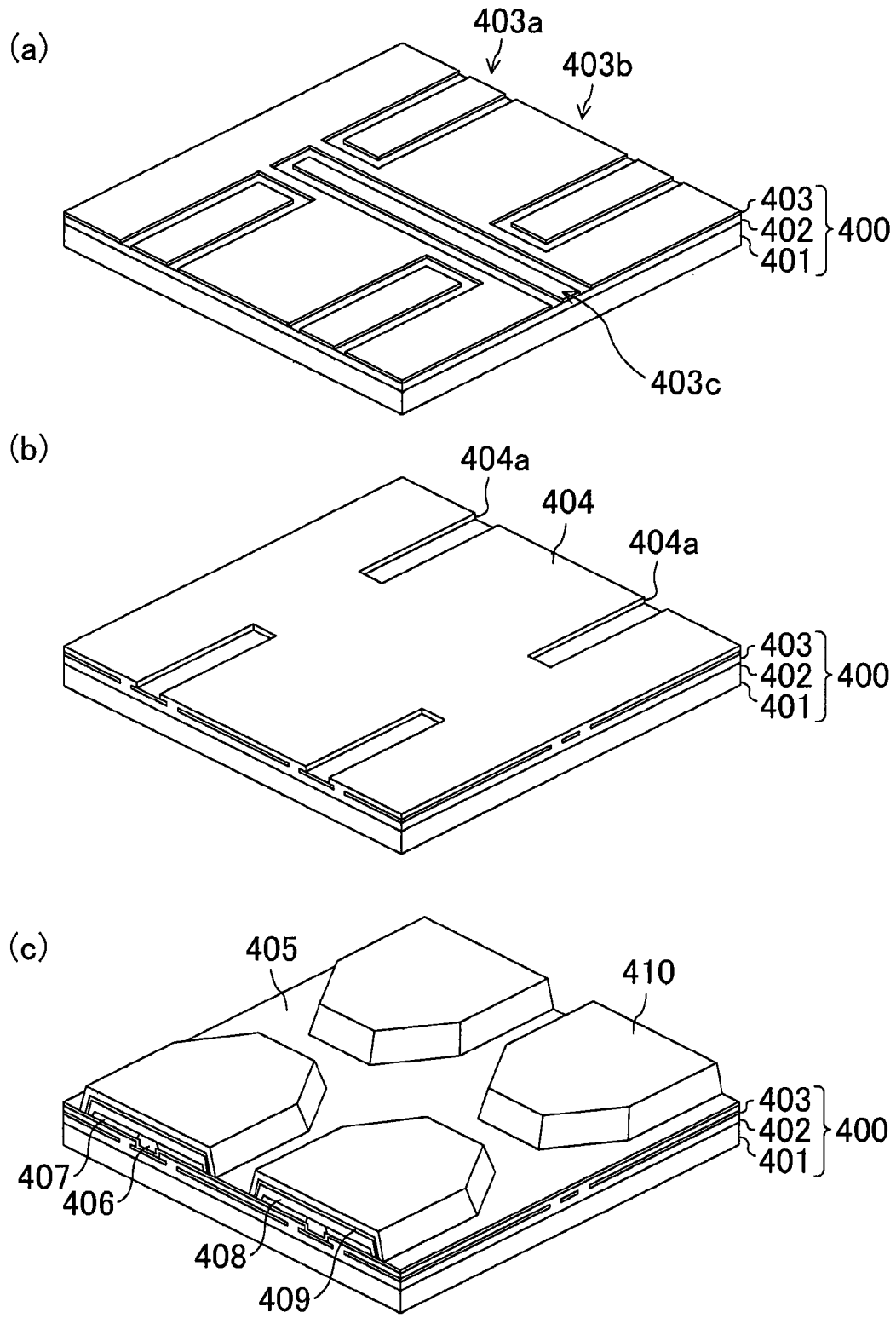
FIGS. 17(a)-17(c) are perspective views for describing a method for fabricating the nitride semiconductor light-emitting device of the third embodiment of the present invention in the order in which the nitride semiconductor light-emitting device is fabricated.

Initially, as shown in FIG. 17(a), the Si thin layer 403 of the SOI substrate 400 including the Si substrate 401, the insulating layer 402 made of $SiO_2$, and the Si thin layer 403 is patterned by light exposure and dry etching employing $CF_4$. Here, the Si thin layer 403 is patterned into first patterns 403a which are to be seed crystal for a seed layer made of GaN, a second pattern 403b which is to be connected to the p-side electrode, and a third pattern 403c which is to be connected to the n-side electrode.

Initially, as shown in FIG. 17(b), the mask film 404 made of $SiO_2$ is deposited on the patterned Si thin layer 403 by plasma enhanced chemical vapor deposition. Next, openings 404a which expose the respective first patterns 403a of the Si thin layer 403 are formed in the mask film 404 by light exposure and dry etching employing $CF_4$.

Next, as shown in FIG. 17(c), the buffer layer 405 made of AlN, the seed layer 406 made of GaN, the LEG layer 407 formed using DMHy, the n-type GaN layer 408, the active layer 409, and the p-type GaN layer 410 are successively grown (crystal growth) on the mask film 404 including the openings 404a by MOCVD. Also in this case, the seed layer 406 is grown only from portions in the openings 404a of the buffer layer 405, and the LEG layer 407 is grown only in lateral directions from the side surfaces of the seed layer 406. Moreover, in this case, the nitride semiconductor layers formed, by crystal growth, from the respective openings 404a of the mask film 404, which constitute the elements A and B, are spaced from each other.

Figure 18:
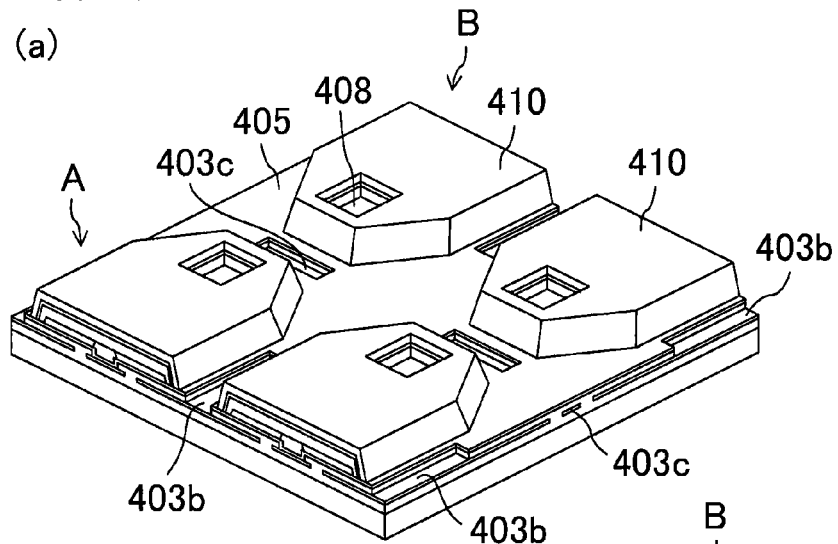
FIGS. 18(a)-18(c) are perspective views for describing the method for fabricating the nitride semiconductor light-emitting device of the third embodiment of the present invention in the order in which the nitride semiconductor light-emitting device is fabricated.
Figure 18:
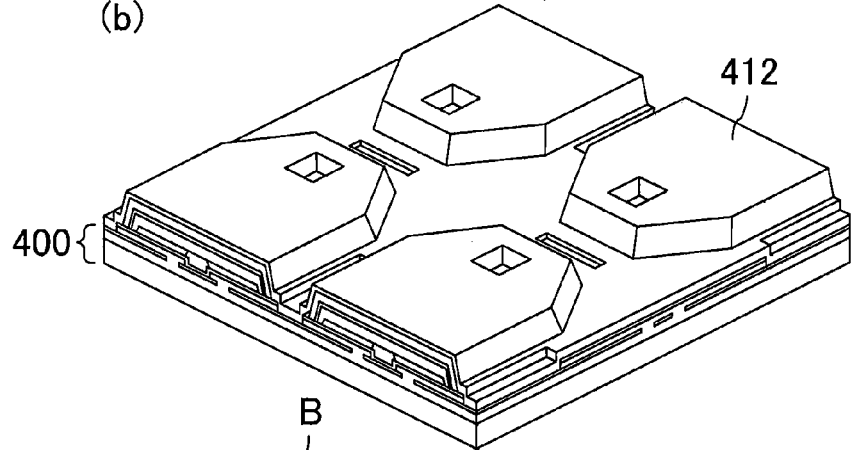
Figure 18:
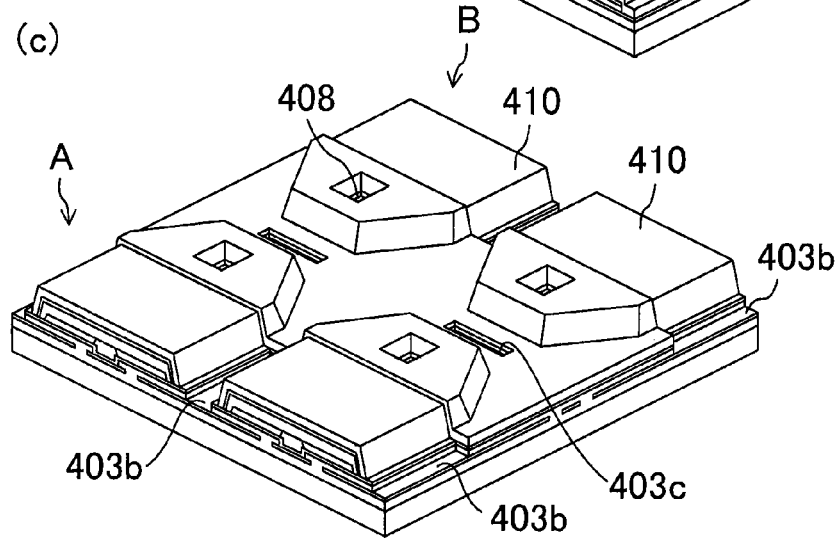

Next, as shown in FIG. 18(a), portions of the buffer layer 405 between the elements A and the elements B and directly above the third pattern 403c of the Si thin layer 403 are etched by light exposure and etching, to selectively expose the third pattern 403c. Also, at the same time, portions of the buffer layer 405 outside the elements A and B and directly above the second pattern 403b of the Si thin layer 403 are etched to selectively expose the second pattern 403b. Moreover, holes penetrating the p-type GaN layer 410 and the active layer 409 are formed in regions of the elements A and B between which the exposed portions of the third pattern 403c are interposed, to selectively expose the underlying n-type GaN layer 408. Here, each nitride semiconductor layer is etched by dry etching using chlorine-based gas, and the mask film 404 made of $SiO_2$ is etched by wet etching using a fluoric acid-based etchant.

Next, as shown in FIG. 18(b), the insulating film 412 made of $SiO_2$ is deposited on an entire surface of the SOI substrate 400 by thermal vapor deposition. Thus, by covering an entire surface of each nitride semiconductor layer with the insulating film 412, a leakage current between the electrodes can be reduced.

Next, as shown in FIG. 18(c), the deposited insulating film 412 is selectively etched to remove portions of the insulating film 412 which are opposite to the regions between the elements A and the elements B, thereby exposing the p-type GaN layer 410. In this case, the exposed portions of the n-type GaN layer 408, and the second pattern 403b and the third pattern 403c of the Si thin layer 403 are exposed again. Note that, also in this case, the mask film 404 is etched using fluoric acid-based wet etching in order to reduce or avoid damage caused by plasma.

Next, the p-side electrodes 411 made of Ni/Au which extend from directly above the exposed p-type GaN layer 410 across the exposed regions of the second pattern 403b of the Si thin layer 403, and the n-side electrodes 413 made of Ti/Au which extend from directly above the exposed n-type GaN layer 408 across the exposed regions of the third pattern 403c of the Si thin layer 403, are formed by vacuum deposition and lift-off processing. In the third embodiment, in order to extract light emitted through the p-side electrodes 411, the Ni and Au films constituting the p-side electrodes 411 are each deposited to a thickness of as thin as several nanometers. As a result, the nitride light-emitting diode of FIG. 16 is obtained.

A feature of the third embodiment is that the p-side electrodes 411 formed by deposition are each shared by the elements A or the elements B, and the n-side electrodes 413 are each shared by the corresponding pair of the elements A and B. Specifically, the p-side electrodes 411 connect the exposed portions of the Si thin layer 403 through the opening regions of the second pattern 403b and the p-type GaN layer 410 via a relatively large area. In contrast to this, the n-side electrodes 413 connect the exposed regions of the Si thin layer 403 through the opening regions of the third pattern 403c and the insulating film 412 on the n-type GaN layer 408.

Moreover, all the elements A and B are connected to the Si thin layer 403 in a similar manner. Therefore, even if a plurality of light-emitting elements are formed on the SOI substrate 400, interconnects cover only a small part of the light-emitting elements, and all the interconnects can be laid out using the second pattern 403b and the third pattern 403c of the Si thin layer 403 located below the nitride semiconductor layer. As a result, the interconnection members can be led to the outside while the emission efficiency of emission light is maintained high.

The elements A and B each have an upwardly convex structure on the SOI substrate 400, and therefore, have a higher light extraction efficiency than that which is achieved when the entire surface has a flat film structure, resulting in more efficient light emission.

In the third embodiment, the p-side electrodes 411 and the n-side electrodes 413 are connected via a plurality of openings, and therefore, are advantageously highly resistant to disconnection and the like.

Although the SOI substrate 400 is employed in the third embodiment, the advantages of the present invention can be obtained even if a $SiO_2$ layer and an n-type polysilicon layer are formed on a typical silicon substrate as in the first and second embodiments. In this case, seed crystal needs to be a surface portion of the underlying silicon substrate.

Although the Si thin layer 403 constitutes the uppermost portion of the SOI substrate 400, similar advantages can be obtained even if the Si thin layer 403 is carbonized so that only the surface thereof becomes silicon carbide (SiC). In the case of SiC, crystal growth is more easily performed because SiC is more difficult to produce an alloy with group III elements than Si.

When the underlying Si substrate 401 of the SOI substrate 400 is conductive, the Si substrate 401 may be electrically connected to one of the second pattern 403b and the third pattern 403c. In this case, one of the electrodes connected to the one of the second pattern 403b and the third pattern 403c can be led from the bottom surface of the Si substrate 401, whereby the light-emitting diode can be more easily mounted.

Fourth Embodiment

A fourth embodiment of the present invention will be described hereinafter with reference to the drawings.

Figure 19:
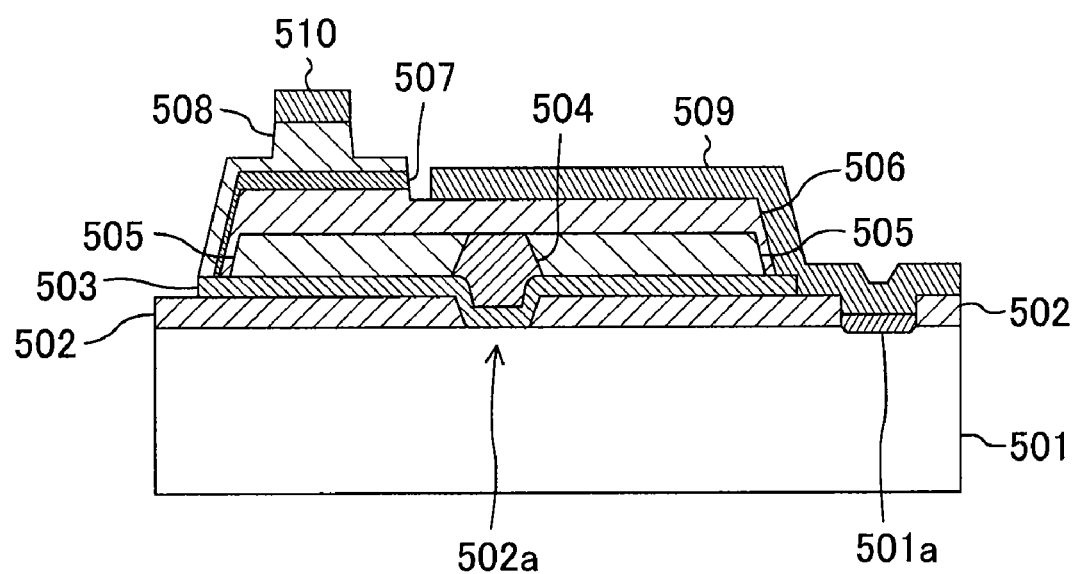
FIG. 19 is a cross-sectional view showing a nitride semiconductor light-emitting device according to a fourth embodiment of the present invention.

FIG. 19 is a cross-sectional view of a structure of a blue-violet semiconductor laser diode which is a nitride semiconductor light-emitting device according to a fourth embodiment of the present invention.

The semiconductor laser diode of FIG. 19 is a blue-violet nitride semiconductor laser diode employing a hexagonal-system GaN-based semiconductor and having an emission wavelength of 405 nm.

As shown in FIG. 19, a mask film 502 made of, for example, SiO$_2$ with a thickness of 50 nm and having an opening 502*a* is formed on a principal surface having a plane orientation (111) (i.e., a (111) plane) of a substrate 501 made of n-type Si. A buffer layer 503 made of, for example, AlN having a thickness of 40 nm is formed on an entire surface including the opening 502*a* of the mask film 502. A seed layer (first nitride semiconductor layer) 504 made of n-type GaN having a thickness of 100 nm is selectively formed, by crystal growth, from the buffer layer 503 on a bottom surface of the opening 502*a*.

LEG layers (second nitride semiconductor layer) 505 are each selectively grown on the mask film 502 in lateral directions (directions parallel to the substrate surface) from a corresponding side surface of the seed layer 504.

An n-type GaN layer 506, an active layer (emission layer) 507 having a multiple quantum well structure made of InGaN, and a p-type GaN layer 508 (the three layers constitute a third nitride semiconductor layer) are successively formed, by crystal growth, on the LEG layers 505 and the seed layer 504.

The p-type GaN layer 508 and the active layer 507 are formed only on one of the two LEG layers 505 formed on the opposite side surfaces of the seed layer 504, and the p-type GaN layer 508 has a stripe-shaped ridge portion extending in a direction <1-100> of the crystal axis.

A p-side electrode 510 made of, for example, Ni/Pt/Au or the like is formed on an upper surface of the ridge portion of the p-type GaN layer 508. An n-side electrode 509 made of Ti/Au is formed across a region of the n-type GaN layer 506 from which the active layer 507 has been removed and an exposed portion of the substrate 501 which is not covered with the mask film 502. Here, a titanium silicide layer 501*a* is formed in the exposed portion (pad region) of the substrate 501 which is not covered with the mask film 502.

A method for fabricating the nitride semiconductor laser diode thus configured will be described hereinafter with reference to the drawings.

Figure 20:
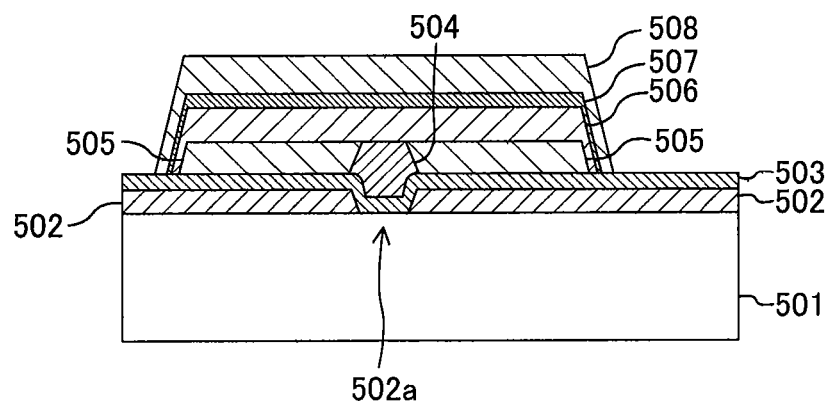
FIGS. 20(a)-20(c) are cross-sectional views for describing a method for fabricating the nitride semiconductor light-emitting device of the fourth embodiment of the present invention in the order in which the nitride semiconductor light-emitting device is fabricated.
Figure 20:
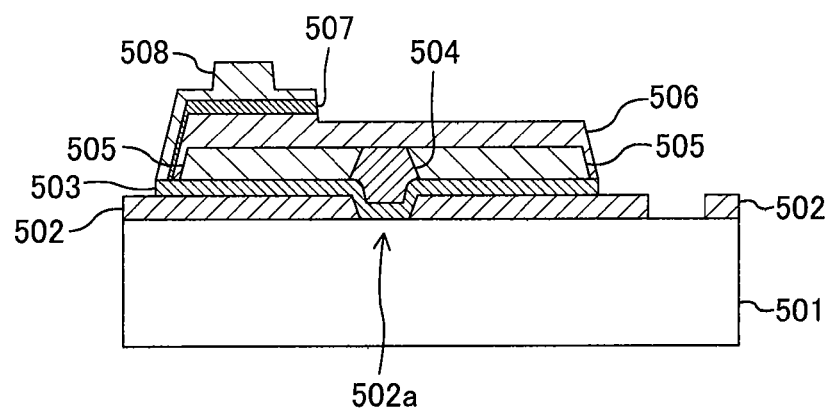
Figure 20:
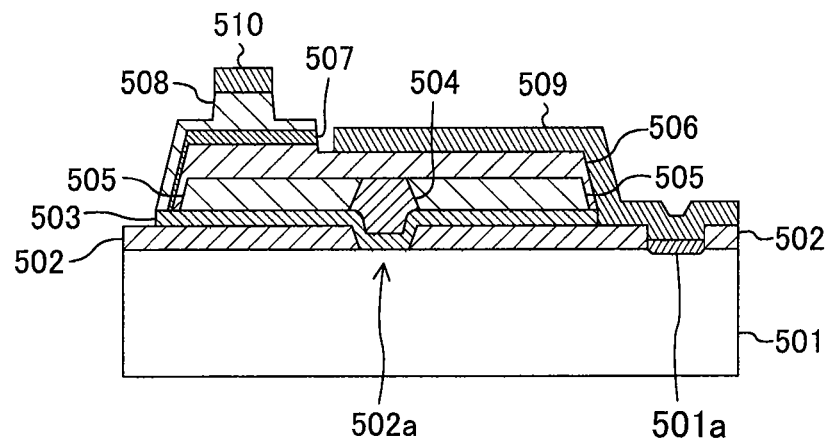

FIGS. 20(*a*)-20(*c*) are cross-sectional views for describing the method for fabricating the nitride light-emitting diode of the fourth embodiment of the present invention in the order in which the nitride light-emitting diode is fabricated.

Initially, as shown in FIG. 20(*a*), as in the first embodiment, the mask film 502 made of SiO$_2$ having the opening 502*a* is formed on a principal surface having a plane orientation (111) (i.e., a (111) plane) of the substrate 501 made of n-type Si. Next, the buffer layer 503 made of AlN, the seed layer 504 made of n-type GaN, the LEG layers 505 formed using DMHy, the n-type GaN layer 506, the active layer 507, and the p-type GaN layer 508 are successively grown (crystal growth) on the mask film 502 including the opening 502*a* by MOCVD. Also in this case, the seed layer 504 is grown only from a portion in the opening 502*a* of the buffer layer 503, and the LEG layers 505 are each grown only in lateral directions from the corresponding side surface of the seed layer 504.

Next, as shown in FIG. 20(*b*), a stripe-shaped ridge portion is formed in the p-type GaN layer 508 directly above one of the LEG layers 505 by ICP dry etching. Moreover, portions of the p-type GaN layer 508, the active layer 507, and the n-type GaN layer 506 which are located lateral to the ridge portion and directly above the seed layer 504 and the other LEG layer 505, are etched to expose the n-type GaN layer 506. In this case, an opening for formation of the electrode pad is formed in a portion outside the other LEG layer 505 of the buffer layer 503 and the mask film 502.

Next, the n-side electrode 509 and the p-side electrode 510 are formed by lift-off processing. Next, the titanium silicide layer 501*a* is formed, by annealing, at a junction surface between the exposed portion of the substrate 501 which is not covered with the mask film 502 and the n-side electrode 509. Thereafter, an electrode which can provide an ohmic junction is also formed on a bottom surface of the substrate 501 by deposition or the like, whereby a current can be injected to the n-side electrode 509 via the bottom surface of the substrate 501.

Next, as shown in FIG. 20(*c*), the substrate 501 in a wafer state is cleaved into chips, whereby laser facets are formed. Here, the cleavage surface of the crystal growth layers made of the nitride semiconductor formed on the substrate 501 made of n-type silicon is parallel to the cleavage surface of the substrate 501. Specifically, a {1-10} plane of silicon matches a {1-100} plane of the nitride semiconductor, and therefore, by cleaving the substrate 501, the nitride semiconductor layers grown on the substrate 501 are also cleaved. As a result, a laser structure can be obtained.

Although the n-type GaN layer 506 and the p-type GaN layer 508 are both a monolayer in the fourth embodiment, the advantages of the present invention are not impaired even if the n-type GaN layer 506 and the p-type GaN layer 508 each have a hetero-structure, such as a short-period superlattice structure or the like, inside thereof. In particular, when the n-type GaN layer 506 has a short-period superlattice structure, the thicknesses of the crystal growth layers can be increased. Therefore, laser light emitted from the active layer 507 is less affected by the substrate 501, resulting in a stabler angle of radiation.

Although the titanium silicide layer 501*a* is formed in the fourth embodiment, the titanium silicide layer 501*a* is not necessarily required when a current is injected to the n-side electrode 509 through an upper surface of the substrate 501. When a current is injected to the n-side electrode 509 through the upper surface of the substrate 501, the deposition of a metal on the bottom surface of the substrate 501 can also be, of course, removed.

INDUSTRIAL APPLICABILITY

The nitride semiconductor light-emitting device of the present invention, even when the substrate for growing a nitride semiconductor is made of silicon, has few defects and is free from cracks, and has high luminance and high reliability, and therefore, is useful for light sources for white illumination, and liquid crystal backlights, and also outdoor display devices and the like. Moreover, when the nitride semiconductor light-emitting device of the present invention is applied to a semiconductor laser diode, the cost per chip can be significantly reduced.

The invention claimed is:

1. A nitride semiconductor light-emitting device comprising:
   a substrate;
   a mask film formed on a principal surface of the substrate and having at least one opening;
   a first nitride semiconductor layer selectively formed on the substrate in the opening;
   a second nitride semiconductor layer formed on a side surface of the first nitride semiconductor layer excluding a surface of the first nitride semiconductor layer parallel to the principal surface of the substrate; and
   a third nitride semiconductor layer formed on the second nitride semiconductor layer and including an emission layer.

2. The nitride semiconductor light-emitting device of claim 1, wherein the second nitride semiconductor layer has a lower hydrogen concentration or a higher carbon concentration than those of the first and third nitride semiconductor layers.

3. The nitride semiconductor light-emitting device of claim 1, wherein the side surface of the first nitride semiconductor layer has an upper portion and a lower portion, and the upper portion is sloped toward the inside of the opening with respect to the lower portion.

4. The nitride semiconductor light-emitting device of claim 1, further comprising:
   a fourth nitride semiconductor layer formed on the mask film, covering the opening, and made of aluminum as a major component,
   wherein
   the first nitride semiconductor layer is formed on the fourth nitride semiconductor layer in the opening.

5. The nitride semiconductor light-emitting device of claim 1, wherein at least one of an interface between the first and second nitride semiconductor layers and an interface between the second and third nitride semiconductor layers does not contain oxygen.

6. The nitride semiconductor light-emitting device of claim 1, wherein the mask film has a reflectance of 50% or more with respect to light emitted by the emission layer.

7. The nitride semiconductor light-emitting device of claim 1, wherein the mask film is conductive and is electrically connected to the third nitride semiconductor layer.

8. The nitride semiconductor light-emitting device of claim 1, wherein a region formed on the opening in the third nitride semiconductor layer is removed.

9. The nitride semiconductor light-emitting device of claim 1, wherein the mask film has a void portion.

10. The nitride semiconductor light-emitting device of claim 1, wherein
    the third nitride semiconductor layer is also formed on the first nitride semiconductor layer, and
    an emission wavelength from the emission layer directly above the second nitride semiconductor layer is longer than an emission wavelength from the emission layer directly above the first nitride semiconductor layer.

11. The nitride semiconductor light-emitting device of claim 1, wherein the substrate is made of silicon.

12. The nitride semiconductor light-emitting device of claim 1, wherein an upper portion of the substrate contacting the mask film has a silicon content of at least 50%.

13. The nitride semiconductor light-emitting device of claim 1, wherein the upper portion of the mask film is made of silicon oxide.

* * * * *